(12) United States Patent
Whetten et al.

(10) Patent No.: US 9,859,205 B2
(45) Date of Patent: Jan. 2, 2018

(54) SEMICONDUCTOR DEVICE HAVING AN AIRBRIDGE AND METHOD OF FABRICATING THE SAME

(71) Applicant: Avago Technologies General IP (Singapore) Pte. Ltd., Singapore (SG)

(72) Inventors: Timothy J. Whetten, Fort Collins, CO (US); Wayne P. Richling, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 96 days.

(21) Appl. No.: 14/551,492

(22) Filed: Nov. 24, 2014

(65) Prior Publication Data

US 2015/0102490 A1 Apr. 16, 2015

Related U.S. Application Data

(62) Division of application No. 13/017,414, filed on Jan. 31, 2011, now Pat. No. 8,962,443.

(51) Int. Cl.
*H01L 21/28* (2006.01)
*H01L 21/32* (2006.01)
(Continued)

(52) U.S. Cl.
CPC ...... *H01L 23/5221* (2013.01); *H01L 21/7682* (2013.01); *H01L 21/7685* (2013.01);
(Continued)

(58) Field of Classification Search
CPC ......... H01L 2924/0002; H01L 2924/00; H01L 21/7682; H01L 21/76832; H01L 21/76834;
(Continued)

(56) References Cited

U.S. PATENT DOCUMENTS 3,174,122 A 3/1965 Fowler et al.
3,321,648 A 5/1967 Kolm
(Continued)

FOREIGN PATENT DOCUMENTS

CN 101170303 9/2011
DE 10160617 6/2003
(Continued)

OTHER PUBLICATIONS

Ng, et aL, "The Diffusion Ion-Implanted Boron in Silicon Dioxide", AIP Cont Proceedings, No. 122, 20-33, 1984.
(Continued)

*Primary Examiner* — Teresa M Arroyo

(57) ABSTRACT

A semiconductor device and a method of forming an airbridge extending from a conductive area of the semiconductor device are provided. The semiconductor device includes a device pattern formed on a semiconductor substrate, a seed layer formed on the device pattern, and an airbridge formed on the seed layer, where the airbridge includes a plated conductive material and defines an opening exposing a portion of the device pattern. The semiconductor device further includes an adhesion layer formed on the airbridge layer and extending over at least a portion of sidewalls of the opening defined by the airbridge, and an insulating layer formed on the adhesion layer, where the adhesion layer enhances adhesion of the insulating layer to the plated conductive material of the airbridge.

17 Claims, 12 Drawing Sheets

(51) Int. Cl.

| | | |
|---|---|---|
| *H01L 23/48* | (2006.01) | |
| *H01L 23/52* | (2006.01) | |
| *H01L 29/40* | (2006.01) | |
| *H01L 23/522* | (2006.01) | |
| *H01L 21/768* | (2006.01) | |
| *H01L 23/482* | (2006.01) | |
| *H01L 23/532* | (2006.01) | |
| *H01L 23/538* | (2006.01) | |

(52) U.S. Cl.
 CPC .... *H01L 21/76838* (2013.01); *H01L 23/4821* (2013.01); *H01L 23/5329* (2013.01); *H01L 23/53252* (2013.01); *H01L 21/76832* (2013.01); *H01L 21/76834* (2013.01); *H01L 23/5381* (2013.01); *H01L 2224/4013* (2013.01); *H01L 2224/4813* (2013.01); *H01L 2924/0002* (2013.01)

(58) Field of Classification Search
 CPC ........... H01L 21/76838; H01L 21/7685; H01L 23/4821; H01L 23/5221; H01L 23/53252; H01L 23/5329; H01L 23/5381; H01L 2224/4013; H01L 2224/4813
 USPC .......................................... 257/745; 438/605
 See application file for complete search history.

(56) References Cited

U.S. PATENT DOCUMENTS

| | | | |
|---|---|---|---|
| 3,422,371 A | 1/1969 | Poirier et al. | |
| 3,568,108 A | 3/1971 | Poirier et al. | |
| 3,582,839 A | 6/1971 | Pim et al. | |
| 3,590,287 A | 6/1971 | Berlincourt et al. | |
| 3,610,969 A | 10/1971 | Clawson et al. | |
| 3,826,931 A | 7/1974 | Hammond | |
| 3,845,402 A | 10/1974 | Nupp | |
| 4,084,217 A | 4/1978 | Brandli et al. | |
| 4,172,277 A | 10/1979 | Pinson | |
| 4,272,742 A | 6/1981 | Lewis | |
| 4,281,299 A | 7/1981 | Newbold | |
| 4,320,365 A | 3/1982 | Black et al. | |
| 4,344,004 A | 8/1982 | Okubo | |
| 4,355,408 A | 10/1982 | Scarrott | |
| 4,456,850 A | 6/1984 | Inoue et al. | |
| 4,529,904 A | 7/1985 | Hattersley | |
| 4,608,541 A | 8/1986 | Moriwaki et al. | |
| 4,625,138 A | 11/1986 | Ballato | |
| 4,633,285 A | 12/1986 | Hunsinger et al. | |
| 4,640,756 A | 2/1987 | Wang et al. | |
| 4,719,383 A | 1/1988 | Wang et al. | |
| 4,769,272 A | 9/1988 | Byrne et al. | |
| 4,798,990 A | 1/1989 | Henoch | |
| 4,819,215 A | 4/1989 | Yokoyama et al. | |
| 4,836,882 A | 6/1989 | Ballato | |
| 4,841,429 A | 6/1989 | McClanahan et al. | |
| 4,906,840 A | 3/1990 | Zdeblick et al. | |
| 4,916,520 A | 4/1990 | Kurashima | |
| 4,933,743 A | 6/1990 | Thomas et al. | |
| 5,006,478 A | 4/1991 | Kobayashi et al. | |
| 5,048,036 A | 9/1991 | Scifres et al. | |
| 5,048,038 A | 9/1991 | Brennan et al. | |
| 5,066,925 A | 11/1991 | Freitag | |
| 5,075,641 A | 12/1991 | Weber et al. | |
| 5,087,959 A | 2/1992 | Omori et al. | |
| 5,111,157 A | 5/1992 | Komiak | |
| 5,118,982 A | 6/1992 | Inoue et al. | |
| 5,129,132 A | 7/1992 | Zdeblick et al. | |
| 5,162,691 A | 11/1992 | Mariani et al. | |
| 5,166,646 A | 11/1992 | Avanic et al. | |
| 5,171,713 A * | 12/1992 | Matthews ......... H01L 21/28211 148/DIG. 20 | |
| 5,185,589 A | 2/1993 | Krishnaswamy et al. | |
| 5,214,392 A | 5/1993 | Kobayashi et al. | |
| 5,233,259 A | 8/1993 | Krishnaswamy et al. | |
| 5,241,209 A | 8/1993 | Sasaki | |
| 5,241,456 A | 8/1993 | Marcinkiewicz et al. | |
| 5,262,347 A | 11/1993 | Sands | |
| 5,270,492 A | 12/1993 | Fukui | |
| 5,294,898 A | 3/1994 | Dworsky et al. | |
| 5,361,077 A | 11/1994 | Weber | |
| 5,382,930 A | 1/1995 | Stokes et al. | |
| 5,384,808 A | 1/1995 | Van Brunt et al. | |
| 5,406,122 A * | 4/1995 | Wong ................ H01L 23/53242 257/276 |
| 5,448,014 A | 9/1995 | Kong et al. | |
| 5,449,953 A * | 9/1995 | Nathanson ........ H01L 21/76264 257/604 |
| 5,465,725 A | 11/1995 | Seyed-Bolortorosh | |
| 5,475,351 A | 12/1995 | Uematsu et al. | |
| 5,548,189 A | 8/1996 | Williams | |
| 5,561,085 A * | 10/1996 | Gorowitz ............ H01L 23/5221 257/E23.143 |
| 5,567,334 A | 10/1996 | Baker et al. | |
| 5,587,620 A | 12/1996 | Ruby et al. | |
| 5,589,858 A | 12/1996 | Kadowaki et al. | |
| 5,594,705 A | 1/1997 | Connor et al. | |
| 5,603,324 A | 2/1997 | Oppelt | |
| 5,633,574 A | 5/1997 | Sage | |
| 5,671,242 A | 9/1997 | Takiguchi et al. | |
| 5,692,279 A | 12/1997 | Mang et al. | |
| 5,698,928 A | 12/1997 | Mang et al. | |
| 5,704,037 A | 12/1997 | Chen | |
| 5,705,877 A | 1/1998 | Shimada | |
| 5,714,917 A | 2/1998 | Ella | |
| 5,729,008 A | 3/1998 | Blalock et al. | |
| 5,789,845 A | 8/1998 | Ivadaka et al. | |
| 5,817,446 A | 10/1998 | Lammed | |
| 5,825,092 A | 10/1998 | Delgado et al. | |
| 5,835,142 A | 11/1998 | Nakamura et al. | |
| 5,853,601 A | 12/1998 | Krishaswamy et al. | |
| 5,864,261 A | 1/1999 | Weber | |
| 5,866,969 A | 2/1999 | Shimada et al. | |
| 5,872,493 A | 2/1999 | Ella | |
| 5,873,153 A | 2/1999 | Ruby et al. | |
| 5,873,154 A | 2/1999 | Ylilammi et al. | |
| 5,894,184 A | 4/1999 | Furuhashi et al. | |
| 5,894,647 A | 4/1999 | Lakin | |
| 5,910,756 A | 6/1999 | Ella | |
| 5,932,953 A | 8/1999 | Drees et al. | |
| 5,936,150 A | 8/1999 | Kobrin et al. | |
| 5,953,479 A | 9/1999 | Zhou | |
| 5,955,926 A | 9/1999 | Uda et al. | |
| 5,962,787 A | 10/1999 | Okada | |
| 5,969,463 A | 10/1999 | Tomita et al. | |
| 5,982,297 A | 11/1999 | Vvelle | |
| 6,001,664 A | 12/1999 | Swirhun et al. | |
| 6,016,052 A | 1/2000 | Vaughn | |
| 6,040,962 A | 3/2000 | Kanazawa et al. | |
| 6,051,907 A | 4/2000 | Ylilammi | |
| 6,060,818 A | 5/2000 | Ruby et al. | |
| 6,087,198 A | 7/2000 | Panasik | |
| 6,090,687 A | 7/2000 | Merchant et al. | |
| 6,099,700 A | 8/2000 | Lee | |
| 6,107,721 A | 8/2000 | Lakin | |
| 6,111,341 A | 8/2000 | Hirama | |
| 6,111,480 A | 8/2000 | Lyama et al. | |
| 6,114,795 A | 9/2000 | Tajima et al. | |
| 6,118,181 A | 9/2000 | Merchant et al. | |
| 6,124,678 A | 9/2000 | Bishop et al. | |
| 6,124,756 A | 9/2000 | Yaklin et al. | |
| 6,131,256 A | 10/2000 | Dydyk et al. | |
| 6,150,703 A | 11/2000 | Cushman et al. | |
| 6,187,513 B1 | 2/2001 | Katakura | |
| 6,198,208 B1 | 3/2001 | Yano et al. | |
| 6,215,375 B1 | 4/2001 | Larson et al. | |
| 6,218,911 B1 * | 4/2001 | Kong ................ H01H 59/0009 200/181 |
| 6,219,032 B1 | 4/2001 | Rosenberg et al. | |
| 6,219,263 B1 | 4/2001 | Inuidart | |
| 6,228,675 B1 | 5/2001 | Ruby et al. | |
| 6,229,247 B1 | 5/2001 | Bishop | |
| 6,252,229 B1 | 6/2001 | Plays et al. | |

(56) References Cited

U.S. PATENT DOCUMENTS

| | | | |
|---|---|---|---|
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,284,121 B1 | 9/2001 | Reid |
| 6,292,336 B1 | 9/2001 | Horng et al. |
| 6,306,755 B1 | 10/2001 | Zheng |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,376,370 B1* | 4/2002 | Farrar | H01L 21/76843 257/762 |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,465,297 B1* | 10/2002 | Henry | H01L 28/40 257/E21.008 |
| 6,466,105 B1 | 10/2002 | Lobl et al. |
| 6,466,418 B1 | 10/2002 | Horng et al. |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella et al. |
| 6,498,604 B1 | 12/2002 | Jensen |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,528,344 B2 | 3/2003 | Kang |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panasik |
| 6,548,943 B2 | 4/2003 | Kaitila et al. |
| 6,549,394 B1 | 4/2003 | Williams |
| 6,550,664 B2 | 4/2003 | Bradley et al. |
| 6,559,487 B1 | 5/2003 | Kang et al. |
| 6,559,530 B2 | 5/2003 | Hinzel et al. |
| 6,564,448 B1 | 5/2003 | Dura et al. |
| 6,566,956 B2 | 5/2003 | Dhnishi et al. |
| 6,566,979 B2 | 5/2003 | Larson et al. |
| 6,580,159 B1 | 6/2003 | Fusaro et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,603,182 B1 | 8/2003 | Low et al. |
| 6,607,934 B2 | 8/2003 | Chang |
| 6,617,249 B2 | 9/2003 | Ruby et al. |
| 6,617,750 B2 | 9/2003 | Dummermuth et al. |
| 6,617,751 B2 | 9/2003 | Sunwoo et al. |
| 6,621,137 B1 | 9/2003 | Ma et al. |
| 6,630,753 B2 | 10/2003 | Malik et al. |
| 6,635,509 B1 | 10/2003 | Duellet |
| 6,639,872 B1 | 10/2003 | Rein |
| 6,651,488 B2 | 11/2003 | Larson et al. |
| 6,657,363 B1 | 12/2003 | Aigner |
| 6,668,618 B2 | 12/2003 | Larson et al. |
| 6,670,866 B2 | 12/2003 | Ella et al. |
| 6,677,929 B2 | 1/2004 | Gordon et al. |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,713,314 B2 | 3/2004 | Wong et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Piazza et al. |
| 6,738,267 B1 | 5/2004 | Navas et al. |
| 6,750,593 B2 | 6/2004 | Iwata |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,798,064 B1* | 9/2004 | Henry | H01L 23/4821 257/750 |
| 6,803,835 B2 | 10/2004 | Frank |
| 6,812,619 B1 | 11/2004 | Kaitila et al. |
| 6,820,469 B1 | 11/2004 | Adkins et al. |
| 6,828,713 B2 | 12/2004 | Bradley et al. |
| 6,842,088 B2 | 1/2005 | Yamada et al. |
| 6,842,089 B2 | 1/2005 | Lee |
| 6,849,475 B2 | 2/2005 | Kim |
| 6,853,534 B2 | 2/2005 | Williams |
| 6,861,920 B2 | 3/2005 | Ishikawa et al. |
| 6,872,931 B2 | 3/2005 | Liess et al. |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Yamada et al. |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson et al. |
| 6,936,837 B2 | 8/2005 | Yamada et al. |
| 6,936,928 B2 | 8/2005 | Fiedler et al. |
| 6,936,954 B2 | 8/2005 | Peczalski |
| 6,941,036 B2 | 9/2005 | Lucero |
| 6,943,647 B2 | 9/2005 | Aigner |
| 6,943,648 B2 | 9/2005 | Maiz et al. |
| 6,946,928 B2 | 9/2005 | Larson et al. |
| 6,954,121 B2 | 10/2005 | Bradley et al. |
| 6,963,257 B2 | 11/2005 | Ella et al. |
| 6,970,365 B2 | 11/2005 | Turchi |
| 6,975,183 B2 | 12/2005 | Aigner et al. |
| 6,977,563 B2 | 12/2005 | Komuro et al. |
| 6,985,051 B2 | 1/2006 | Nguyen et al. |
| 6,985,052 B2 | 1/2006 | Tikka |
| 6,987,433 B2 | 1/2006 | Larson et al. |
| 6,989,723 B2 | 1/2006 | Komuro et al. |
| 6,998,940 B2 | 2/2006 | Metzger |
| 7,002,437 B2 | 2/2006 | Takeuchi et al. |
| 7,019,604 B2 | 3/2006 | Gotoh et al. |
| 7,019,605 B2 | 3/2006 | Larson |
| 7,026,876 B1 | 4/2006 | Esfandiari et al. |
| 7,053,456 B2 | 5/2006 | Matsuo |
| 7,057,476 B2 | 6/2006 | Hwu |
| 7,057,478 B2 | 6/2006 | Korden et al. |
| 7,064,606 B2 | 6/2006 | Louis |
| 7,084,553 B2 | 8/2006 | Ludwiczak |
| 7,091,649 B2 | 8/2006 | Larson et al. |
| 7,098,758 B2 | 8/2006 | Wang et al. |
| 7,102,460 B2 | 9/2006 | Schmidhammer et al. |
| 7,109,826 B2 | 9/2006 | Ginsburg et al. |
| 7,128,941 B2 | 10/2006 | Lee |
| 7,129,806 B2 | 10/2006 | Sato |
| 7,138,889 B2 | 11/2006 | Lakin |

(56) References Cited

U.S. PATENT DOCUMENTS

| | | |
|---|---|---|
| 7,161,448 B2 | 1/2007 | Feng et al. |
| 7,170,215 B2 | 1/2007 | Mamba et al. |
| 7,173,504 B2 | 2/2007 | Larson et al. |
| 7,187,254 B2 | 3/2007 | Su et al. |
| 7,199,683 B2 | 4/2007 | Thalhammer |
| 7,209,374 B2 | 4/2007 | Noro |
| 7,212,083 B2 | 5/2007 | Inoue et al. |
| 7,212,085 B2 | 5/2007 | Wu |
| 7,230,509 B2 | 6/2007 | Stoemmer |
| 7,230,511 B2 | 6/2007 | Onishi et al. |
| 7,233,218 B2 | 6/2007 | Park et al. |
| 7,242,270 B2 | 7/2007 | Larson et al. |
| 7,259,498 B2 | 8/2007 | Nakatsuka et al. |
| 7,268,647 B2 | 9/2007 | Sano et al. |
| 7,275,292 B2 | 10/2007 | Ruby et al. |
| 7,276,994 B2 | 10/2007 | Takeuchi et al. |
| 7,280,007 B2 | 10/2007 | Feng et al. |
| 7,281,304 B2 | 10/2007 | Kim et al. |
| 7,294,919 B2 | 11/2007 | Bai |
| 7,301,258 B2 | 11/2007 | Tanaka |
| 7,310,861 B2 | 12/2007 | Aigner et al. |
| 7,313,255 B2 | 12/2007 | MacHida et al. |
| 7,332,985 B2 | 2/2008 | Larson et al. |
| 7,345,410 B2 | 3/2008 | Grannen et al. |
| 7,358,831 B2 | 4/2008 | Larson et al. |
| 7,367,095 B2 | 5/2008 | Larson, III et al. |
| 7,368,857 B2 | 5/2008 | Tanaka |
| 7,369,013 B2 | 5/2008 | Fazzio et al. |
| 7,377,168 B2 | 5/2008 | Liu |
| 7,385,467 B2 | 6/2008 | Stoemmer et al. |
| 7,388,318 B2 | 6/2008 | Yamada et al. |
| 7,388,454 B2 | 6/2008 | Ruby et al. |
| 7,388,455 B2 | 6/2008 | Larson et al. |
| 7,391,286 B2 | 6/2008 | Jamneala et al. |
| 7,400,217 B2 | 7/2008 | Larson, III et al. |
| 7,408,428 B2 | 8/2008 | Larson, III et al. |
| 7,414,349 B2 | 8/2008 | Sasaki |
| 7,414,495 B2 | 8/2008 | Iwasaki et al. |
| 7,420,320 B2 | 9/2008 | Sano et al. |
| 7,423,503 B2 | 9/2008 | Larson, III et al. |
| 7,425,787 B2 | 9/2008 | Larson, III |
| 7,439,824 B2 | 10/2008 | Aigner et al. |
| 7,463,118 B2 | 12/2008 | Jacobsen |
| 7,466,213 B2 | 12/2008 | Lobl et al. |
| 7,482,737 B2 | 1/2009 | Yamada et al. |
| 7,508,286 B2 | 3/2009 | Ruby et al. |
| 7,515,018 B2 | 4/2009 | Handtmann et al. |
| 7,535,324 B2 | 5/2009 | Fattinger et al. |
| 7,545,532 B2 | 6/2009 | Muramoto |
| 7,561,009 B2 | 7/2009 | Larson, III et al. |
| 7,576,471 B1 | 8/2009 | Solal |
| 7,602,101 B2 | 10/2009 | Hara et al. |
| 7,619,493 B2 | 11/2009 | Uno et al. |
| 7,629,865 B2 | 12/2009 | Ruby |
| 7,642,693 B2 | 1/2010 | Akiyama et al. |
| 7,655,963 B2 | 2/2010 | Sadaka et al. |
| 7,684,109 B2 | 3/2010 | Godshalk et al. |
| 7,758,979 B2 | 7/2010 | Akiyama et al. |
| 7,768,364 B2 | 8/2010 | Hart et al. |
| 7,791,434 B2 | 9/2010 | Fazzio et al. |
| 7,795,781 B2 | 9/2010 | Barber et al. |
| 7,889,024 B2 | 2/2011 | Bradley et al. |
| 8,330,325 B1 | 12/2012 | Burak et al. |
| 8,507,919 B2 | 8/2013 | Ishikura |
| 8,673,121 B2 | 3/2014 | Larson et al. |
| 8,872,604 B2 | 10/2014 | Burak et al. |
| 2001/0026951 A1 | 10/2001 | Vergani et al. |
| 2002/0000646 A1 | 1/2002 | Gooch et al. |
| 2002/0063497 A1 | 5/2002 | Panasik |
| 2002/0070463 A1 | 6/2002 | Chang |
| 2002/0126517 A1 | 9/2002 | Matsukawa et al. |
| 2002/0140520 A1 | 10/2002 | Nikita et al. |
| 2003/0001251 A1 | 1/2003 | Cheever et al. |
| 2003/0006502 A1 | 1/2003 | Karpman |
| 2003/0011285 A1 | 1/2003 | Dssmann |
| 2003/0011446 A1 | 1/2003 | Bradley |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0119221 A1* | 6/2003 | Cunningham ........ B81B 3/0024 438/52 |
| 2003/0132493 A1 | 7/2003 | Kang et al. |
| 2003/0132809 A1 | 7/2003 | Senthilkumar et al. |
| 2003/0141946 A1 | 7/2003 | Ruby et al. |
| 2003/0155574 A1 | 8/2003 | Doolittle |
| 2003/0179053 A1 | 9/2003 | Aigner et al. |
| 2004/0016995 A1 | 1/2004 | Kuo et al. |
| 2004/0017130 A1 | 1/2004 | Wang et al. |
| 2004/0056735 A1 | 3/2004 | Nomura et al. |
| 2004/0092234 A1 | 5/2004 | Pohjonen |
| 2004/0099898 A1 | 5/2004 | Grivna |
| 2004/0129079 A1 | 7/2004 | Kato et al. |
| 2004/0150296 A1 | 8/2004 | Park et al. |
| 2004/0166603 A1 | 8/2004 | Carley |
| 2004/0195937 A1 | 10/2004 | Matsubara |
| 2004/0257171 A1 | 12/2004 | Park et al. |
| 2005/0012716 A1 | 1/2005 | Mikulin et al. |
| 2005/0023699 A1* | 2/2005 | Ahn ..................... H01L 21/288 257/762 |
| 2005/0023931 A1 | 2/2005 | Bouche et al. |
| 2005/0036604 A1 | 2/2005 | Scott et al. |
| 2005/0082626 A1 | 4/2005 | Leedy |
| 2005/0093655 A1 | 5/2005 | Larson, III et al. |
| 2005/0093658 A1 | 5/2005 | Larson, III et al. |
| 2005/0167795 A1 | 8/2005 | Higashi |
| 2005/0206271 A1 | 9/2005 | Higuchi et al. |
| 2005/0206479 A1 | 9/2005 | Nguyen et al. |
| 2005/0206483 A1 | 9/2005 | Pashby et al. |
| 2005/0248232 A1 | 11/2005 | Itaya |
| 2005/0269904 A1 | 12/2005 | Oka |
| 2006/0017352 A1 | 1/2006 | Tanielian |
| 2006/0081048 A1 | 4/2006 | Mikado et al. |
| 2006/0087199 A1 | 4/2006 | Larson, III et al. |
| 2006/0119453 A1 | 6/2006 | Fattinger et al. |
| 2006/0121686 A1 | 6/2006 | Wei et al. |
| 2006/0125489 A1 | 6/2006 | Feucht et al. |
| 2006/0160353 A1 | 7/2006 | Gueneau De Mussy et al. |
| 2006/0164183 A1 | 7/2006 | Tikka et al. |
| 2006/0164186 A1 | 7/2006 | Stoemmer et al. |
| 2006/0197411 A1 | 9/2006 | Hoen et al. |
| 2006/0238070 A1 | 10/2006 | Costa et al. |
| 2006/0284707 A1 | 12/2006 | Larson, III et al. |
| 2006/0290446 A1 | 12/2006 | Aigner et al. |
| 2007/0035364 A1 | 2/2007 | Sridhar et al. |
| 2007/0037311 A1 | 2/2007 | Izumi et al. |
| 2007/0085213 A1 | 4/2007 | Ahn et al. |
| 2007/0085632 A1 | 4/2007 | Larson, III et al. |
| 2007/0086080 A1 | 4/2007 | Larson, III et al. |
| 2007/0086274 A1 | 4/2007 | Nishimura et al. |
| 2007/0090892 A1 | 4/2007 | Larson, III |
| 2007/0170815 A1 | 7/2007 | Unkrich |
| 2007/0171002 A1 | 7/2007 | Unkrich |
| 2007/0176710 A1 | 8/2007 | Jamneala et al. |
| 2007/0205850 A1 | 9/2007 | Jamneala et al. |
| 2007/0291164 A1 | 12/2007 | Goh et al. |
| 2008/0297278 A1 | 12/2008 | Handtmann et al. |
| 2008/0297279 A1 | 12/2008 | Thalhammer et al. |
| 2008/0297280 A1 | 12/2008 | Thalhammer et al. |
| 2009/0064498 A1 | 3/2009 | Mok et al. |
| 2009/0079302 A1 | 3/2009 | Wall et al. |
| 2009/0096550 A1 | 4/2009 | Handtmann et al. |
| 2009/0127978 A1 | 5/2009 | Asai et al. |
| 2009/0153268 A1 | 6/2009 | Milsom et al. |
| 2009/0201594 A1 | 8/2009 | Smith |
| 2010/0013573 A1 | 1/2010 | Umeda |
| 2010/0052176 A1 | 3/2010 | Kamada et al. |
| 2010/0091370 A1 | 4/2010 | Mahrt et al. |
| 2010/0102358 A1 | 4/2010 | Lanzieri et al. |
| 2010/0148637 A1 | 6/2010 | Satou |
| 2010/0176899 A1 | 7/2010 | Schaufele et al. |
| 2010/0187948 A1 | 7/2010 | Sinha et al. |
| 2010/0187949 A1 | 7/2010 | Pahl et al. |
| 2010/0207011 A1 | 8/2010 | Smith |

(56) References Cited

U.S. PATENT DOCUMENTS

| | | |
|---|---|---|
| 2010/0260453 A1 | 10/2010 | Block |
| 2010/0327697 A1 | 12/2010 | Choy et al. |
| 2010/0327994 A1 | 12/2010 | Choy et al. |
| 2011/0092067 A1 | 4/2011 | Bonilla et al. |
| 2011/0121689 A1 | 5/2011 | Grannen et al. |
| 2011/0180391 A1 | 7/2011 | Larson et al. |
| 2011/0204997 A1 | 8/2011 | Elbrecht et al. |
| 2011/0266917 A1 | 11/2011 | Metzger et al. |
| 2012/0218055 A1 | 8/2012 | Burak et al. |
| 2012/0218056 A1 | 8/2012 | Burak |
| 2012/0248941 A1 | 10/2012 | Shirakawa et al. |
| 2013/0003377 A1 | 1/2013 | Sakai et al. |
| 2013/0106534 A1 | 5/2013 | Burak et al. |
| 2013/0127300 A1 | 5/2013 | Umeda et al. |
| 2013/0221454 A1 | 8/2013 | Dunbar, III et al. |
| 2013/0334625 A1 | 12/2013 | Lin |

FOREIGN PATENT DOCUMENTS

| | | |
|---|---|---|
| DE | 10239317 | 3/2004 |
| EP | 231892 | 8/1987 |
| EP | 637875 | 2/1995 |
| EP | 689254 | 12/1995 |
| EP | 865157 | 9/1998 |
| EP | 880227 | 11/1998 |
| EP | 1047189 | 10/2000 |
| EP | 1096259 | 5/2001 |
| EP | 1100196 | 5/2001 |
| EP | 1180494 | 2/2002 |
| EP | 1249932 | 10/2002 |
| EP | 1258989 | 11/2002 |
| EP | 1258990 | 11/2002 |
| EP | 1517443 | 3/2005 |
| EP | 1517444 | 3/2005 |
| EP | 1528674 | 5/2005 |
| EP | 1528675 | 5/2005 |
| EP | 1528676 | 5/2005 |
| EP | 1528677 | 5/2005 |
| EP | 1542362 | 6/2005 |
| EP | 1557945 | 6/2005 |
| EP | 1575165 | 9/2005 |
| EP | 0973256 | 9/2006 |
| EP | 2299593 | 3/2011 |
| GB | 1207974 | 10/1970 |
| GB | 2013343 | 8/1979 |
| GB | 2411239 | 8/2005 |
| GB | 2418791 | 4/2006 |
| GB | 2427773 | 1/2007 |
| JP | 59023612 | 2/1984 |
| JP | 61054686 | 3/1986 |
| JP | 62109419 | 5/1987 |
| JP | 62200813 | 9/1987 |
| JP | 1295512 | 11/1989 |
| JP | 210907 | 1/1990 |
| JP | 06005944 | 1/1994 |
| JP | 8330878 | 12/1996 |
| JP | 09-027729 | 1/1997 |
| JP | 983029 | 3/1997 |
| JP | 1032456 | 2/1998 |
| JP | 1-157108 | 6/1998 |
| JP | 10173479 | 6/1998 |
| JP | 10308645 | 11/1998 |
| JP | 2000031552 | 1/2000 |
| JP | 2000076295 | 3/2000 |
| JP | 2000232334 | 8/2000 |
| JP | 2000295065 | 10/2000 |
| JP | 2000332568 | 11/2000 |
| JP | 2001102901 | 4/2001 |
| JP | 2001508630 | 6/2001 |
| JP | 2001257560 | 9/2001 |
| JP | 2002515667 | 5/2002 |
| JP | 2002217676 | 8/2002 |
| JP | 2003017964 | 1/2003 |
| JP | 2003017974 | 1/2003 |
| JP | 2003505905 | 2/2003 |
| JP | 2003505906 | 2/2003 |
| JP | 2003124779 | 4/2003 |
| JP | 2003332872 | 11/2003 |
| JP | 2005159402 | 6/2005 |
| JP | 2006109472 | 4/2006 |
| JP | 2006295924 | 10/2006 |
| JP | 2006319796 | 11/2006 |
| JP | 2007006501 | 1/2007 |
| JP | 2007028669 | 2/2007 |
| JP | 2007295306 | 11/2007 |
| KR | 20020050729 | 6/2002 |
| KR | 20030048917 | 6/2003 |
| WO | 9816957 | 4/1998 |
| WO | 9838736 | 9/1998 |
| WO | 9856049 | 12/1998 |
| WO | 9937023 | 7/1999 |
| WO | 01/06647 | 1/2001 |
| WO | 0199276 | 12/2001 |
| WO | 02/103900 | 12/2002 |
| WO | 03/030358 | 4/2003 |
| WO | 03/043188 | 5/2003 |
| WO | 03/050950 | 6/2003 |
| WO | 03/058809 | 7/2003 |
| WO | 2004034579 | 4/2004 |
| WO | 2004051744 | 6/2004 |
| WO | 2004102688 | 11/2004 |
| WO | 2005043752 | 5/2005 |
| WO | 2005043753 | 5/2005 |
| WO | 2005043756 | 5/2005 |
| WO | 2006018788 | 2/2006 |
| WO | 01/06646 | 1/2011 |

OTHER PUBLICATIONS

Ohta, et al., "Temperature Characteristics of Solidly Mounted Piezoelectric Thin Film Resonators", IEEE Ultrasonics Symposium, Honolulu, HI, 2011-2015, Oct. 2003.

Pandey, et al., "Anchor Loss Reduction in Resonant MEMS using MESA Structures", Proceedings of the 2nd IEEE International Conference on Nano/Micro Engineered and Molecular Systems, Bangkok, Thailand, 880-885, Jan. 16-19 2007.

Pang, et al., "High Q Single-Mode High-Tone Bulk Acoustic Resonator Integrated With Surface-Machined FBAR Filter", Microwave Symposium Digest, IEEE MTT-S International, 413-416, 2005.

Parker, et al., "Temperature-Compensated Surface Acoustic-Wave Devices with SiO2 Film Overlays", J. Appl. Physics, vol. 50, 1360-1369, Mar. 1979.

Densala, et al., "Spurious resonance supression in gigahertz-range ZnO thin-film bulk acoustic wave resonators by the boundary frame method: modeling and experiment", IEEE Transactions on Ultrasonics, Ferroelectrics, and Frequency control, vol. 56, No. 8, 1731-1744, Aug. 2009.

Pensala, "Thin film bulk acoustic wave devices: performance optimization and modeling", http://www.vtt.fi/inf/pdf/publications/2011/P756.pdf.

Reinhardt, et al., "Design of Coupled Resonator Filters Using Admittance and Scattering Matrices", 2003 IEEE Ultrasonics Symposium, 1428-1431, May 3, 2003.

Ruby, "MicroMachined Thin Film Bulk Acoustic Resonators", IEEE Frequency Control Symposium, 135-138, 1994.

Ruby, et al., "The Effect of Perimeter Geometry on FBAR Resonator Electrical Performance", Microwave Symposium Digest, 2005 IEEE MTT-S International, 217-221, Jun. 1, 2005.

Sanchez, et al., "Mixed Analytical and Numerical Design Method for Piezoelectric Transformers", IEEE Xplore, 841-846, 2003.

Schoenholz, et al., "Plasma-Enhanced Deposition of Silicon Oxynitride Films", Thin Solid Films, 285-291, 1987.

Schuessler, "Ceramic Filters and Resonators", Reprinted from IEEE Trans. Sonics Ultrason., vol. SU-21, 257-268, Oct. 1974.

Shirakawa, et al., "Bulk Acoustic Wave Coupled Resonator Filters Synthesis Methodology", 2005 European Microwave aonference, vol. 1, Oct. 2005.

Small, et al., "A De-Coupled Stacked Bulk Acoustic Resonator (DSBAR) Filter with 2 dB Bandwidth >4% 2007", IEEE Ultrason-

(56) References Cited

OTHER PUBLICATIONS ics Symposium, 604-607, Oct. 2007.
Tas, et al., "Reducing Anchor Loss in Micromechanical Extensional Mode Resonators", IEEE Transactions on Ultrasonics, Ferroelectrics and Frequency Control, vol. 57, No. 2. 448-454, Feb. 2010.
Thomsen, et al., "Surface Generation and Detection of Phonons by Picosecond Light Pulses", Phys. Rev. B, vol. 34, 4129, 1986.
Tiersten, et al., "An Analysis of Thickness-Extensional Trapped Energy Resonant Device Structures with Rectangular Electrodes in the Piezoelectric Thin Film on Silicon Configuration" J. Appl. Phys., 54 (10), 5893-5910, Oct. 1983.
Topichi, et al.,"Effects of Ion Implanted Fluorine in Silicon Dioxide", Nuclear Instr. and Methods, Cecon Rec, Cleveland, OH, 70-73, May 1978.
Tsubouchi, et al., "Zero Temperature coefficient Surface Acoustic Wave Devices using Epitaxial AlN Films", IEEE Ultrasonic symposium, San Diego, CA, 1082, 240-245, 1982.
Vasic, et al., "A New Method to Design Piezoelectric Transformer Used in MOSFET & IGBT Drive Circuits", IEEE 34th Annual Power Electronics Specialists Conference, 2003, vol. 1, 307-312, Jun. 15-19, 2003.
Vasic, et al., "A New MOSFET & IGBT Gate Drive Insulated by a Piezoelectric Transformer", IEEE 32nd Annual Power' Electronics Specialists Conference, vol. 3, 1479-1484, 2001.
Yanagitani, et al., "Giant Shear Mode Electromechanical Coupling Coefficient k15 in C-Axis Tilted ScAlN Films", IEEE International Ultrasonics Symposium, 2010.
Yang, et al., "Highly C Axis Oriented AlN Film Using MOCVD for 5GHx Band FBAR Filter", 2003 IEEE Ultrasonics Symposium, pp. 170-173, Oct. 5, 2003.
C-S Lee, et al., "Copper-Airbridged Low-Noise GaAs PHEMT With Ti/WNx/Ti Diffusion Barrier for High-Frequency Applications", IEEE Transactions on Electron Devices, vol. 53, Issue: 8, Publication Year: 2006, pp. 1753-1758.
Machine Translation for JP2003017964 published Jan. 17, 2003.
Machine Translation for WO02/103900 published Dec. 27, 2002.
Machine Translation for WO03/030358 published Apr. 10, 2003.
Machine Translation for WO03/043188 published May 22, 2003.
Machine Translation for WO03/050950 published Jun. 19, 2003.
Machine Translation for JP10173479 published Jun. 26, 1998.
Machine Translation for KR20030048917 published Jun. 25, 2003.
Machine Translation for DE10160617 published Jun. 12, 2003.
Machine Translation for DE10239317 published Mar. 11, 2004.
Machine Translation for CN101170303 published Sep. 14, 2011.
Machine Translation for JP1032456 published Feb. 3, 1998.
Machine Translation for JP06005944 published Jan. 14, 1994.
Machine Translation for JP2000076295 published Mar. 14, 2000.
Machine Translation for JP2000232334 published Aug. 22, 2000.
Machine Translation for JP2000295065 published Oct. 20, 2000.
Machine Translation for JP2000031552 published Jan. 28, 2000.
Machine Translation for JP2000332568 published Nov. 30, 2000.
Machine Translation for JP2001102901 published Apr. 13, 2001.
Machine Translation for JP2001257560 published Sep. 21, 2001.
Machine Translation for JP2001508630 published Jun. 26, 2001.
Machine Translation for JP2002217676 published Aug. 2, 2002.
Machine Translation for KR20020050729 published Jun. 27, 2002.
Machine Translation for JP2002515667 published May 28, 2002.
Machine Translation for JP10308645 published Nov. 17, 1998.
Ivensky, et al., "A Comparison of Piezoelectric Transformer AC/DC Converters with Current Doubler and voltage Doubler Rectifiers", IEEE Transactions on Power Electronics, vol. 19, No. 6. Nov. 2004.
Jamneala, et al., "Coupled Resonator Filter with Single-Layer Acoustic Coupler", IEEE Transaction on Ultrasonics, Ferroelectrics, and Frequency Control, vol. 55, 2320-2326, Oct. 2008.
Jamneala, et al., "Ultra-Miniature Coupled Resonator Filter with Single-Layer Acoustic Coupler", IEEE Transactions on Ultrasonics, Ferroelectrics, and Frequency Control, vol. 56, No. 11. 2553-2558, Nov. 2009.

Jiang, et al., "A Novel Single-Phase Power Factor Correction Scheme", IEEE, 287-292, 1993.
Jung, et al., "Experimental and Theoretical Investigation on the Relationship Between AlN Properties and AlN-Based FBAR Characteristics", 2003 IEEE International Frequency Control Symposium and PDA Exhibition Jointly with the 17th European Frequency and Time Forum, 779-784, Sep. 3, 2003.
Kaitila, et al., "Measurement of Acoustical Parameters of Thin Films", 2006 IEEE Ultrasonics Symposium, 464-467, Oct. 2006.
Krishnaswamy, et al., "Film Bulk Acoustic Wave Resonator Technology", 529-536, May 29, 1990.
Lakin, "Bulk Acoustic Wave Coupled Resonator Filters", 2002 IEEE International Frequency Control Symposium and PDA Exhibition, May 8-14, 2002.
Lakin, "Coupled Resonator Filters", 2002 IEEE Ultrasonics Symposium, 901-908, Mar. 2, 2002.
Lakin, et al., "High Performance Stacked Crystal Filters for GPS and Wide Bandwidth Applications", 2001 IEEE Ultrasonics Symposium, 833-838, Jan. 1, 2001.
Lakin, et al., "Temperature Compensated Bulk Acoustic Thin Film Resonators", IEEE Ultrasonics Symposium, San Juan, Puerto Rico, 855-858, Oct. 2000.
Lakin, "Thin Film Baw Filters for Wide Bandwidth and High Performance Applications", IEEE Microwave Symposium Digest, vol. 2, 923-926, Jun. 6-11, 2004.
Lakin, "Thin Film Resonators and Filters", IEEE Untrasonics Symposium, Caesar's Tahoe, NV, 895-906, Oct. 1999.
Lakin, et al., "Wide Bandwidth Thin Film Baw Filters", 2004 IEEE Ultrasonics Symposium, vol. 1, 407-410, Aug. 2004.
Larson, et al., "Measurement of Effective Kt2,Q,Rp,Rs vs. Temperature for Mo/AlN FBAR Resonators", IEEE Ultrasonics Symposium, 939-943, 2002.
Lee, et al., "Optimization of Frame-Like Film Bulk Acoustic Resonators for Suppression of Spurious Lateral Modes Using Finite Element Method", IEEE Ultrasonic Symposium, vol. 1, 278-281, 2004.
Li, et al., "AC-DC Converter with Worldwide Range Input Voltage by Series and Parallel Piezoelectric Transformer Connection", 35th Annual IEEE Power Electronics Specialists Conference, 2004.
Lobl, et al., "Piezoelectric Materials for BAW Resonators and Filters", 2001 IEEE Ultrasonics Symposium, 807-811, Jan. 1, 2001.
Loboda, "New Solutions for Intermetal Dielectrics Using Trimethylsilane-Based PECVD Processes", Microelectronics Eng., vol. 50. 15-23, 2000.
Lynch, "Precise Measurements on Dielectric and Magnetic Materials", IEEE Transactions on Instrumentation and Measurement, 425-431, Dec. 1974.
Martin, et al., "Development of a Low Dielectric Constant Polymer for the Fabrication of Integrated Circuit Interconnect", Advanced Materials, 1769-1778, Dec. 23, 2000.
Martin, et al., "Re-growth of C-Axis Oriented AlN Thin Films", IEEE Ultrasonics Symposium, 169-172, 2006.
Martin, et al., "Shear Mode Coupling and Tilted Gram Growth of AlN Thin Films in BAW Resonators", IEEE Transactions on Ultrasonics, Ferroelectrics, and Frequency Control, vol. 53, No. 7, 1339-1343, Jul. 2006.
Martinez, et al., "High confinement suspended micro-ring resonators in silicon-on-insulator", Optics Express, vol. 14, No. 13, 6259-6263, Jun. 26, 2006.
Navas, et al., "Miniaturised Battery Charger using Piezoelectric Transformers", IEEE, 492-496, 2001.
Machine Translation for JP2003124779 published Apr. 25, 2003.
Machine Translation for JP2003017974 published Jan. 17, 2003.
Machine Translation for JP2003332872 published Nov. 21, 2003.
Machine Translation for JP2003505905 published Feb. 12, 2003.
Machine Translation for JP2003505906 published Feb. 12, 2003.
Machine Translation for WO2004034579 published Apr. 22, 2004.
Machine Translation for WO2004102688 published Nov. 25, 2004.
Machine Translation for JP2005159402 published Jun. 16, 2005.
Machine Translation for JP8330878 published Dec. 13, 1996.
Machine Translation for WO9838736 published Sep. 3, 1998.
Machine Translation for WO9937023 published Jul. 22, 1999.

(56) References Cited

OTHER PUBLICATIONS

GB Search Report for Application No. GB0522393.8 4 pages Jan. 9, 2006.
GB Search Report for Application No. GB0525884.3 4 pgs. Feb. 2, 2006.
British Search Report Application No. 0605222.9 Jul. 11, 2006.
Machine Translation for JP2006109472 published Apr. 20, 2006.
Machine Translation for JP2006295924 published Oct. 26, 2006.
Machine Translation for JP2006319796 published Nov. 24, 2006.
Examination report corresponding to application No. GB0605770.7 Aug. 25, 2006.
Examination Report from UK for application GB0605971.1 Aug. 24, 2006.
Search Report for Great Britain Patent Application No. 0617742.2 Mar. 29, 2007.
Search Report from corresponding application No. GB0605225.2 Jun. 26, 2006.
Search report from corresponding application No. GB0620152.9 Nov. 15, 2006.
Search report from corresponding application No. GB0620655.1 Nov. 17, 2006.
Search report from corresponding application No. GB0620653.6 Nov. 17, 2006.
Search Report from corresponding application No. GB0620657.7 Nov. 23, 2006.
Search Report from corresponding application No. GB 0605779.8 Aug. 23, 2006.
Search Report in the Great Britian Patent Application No. 0619698.4 Nov. 30, 2006.
Akiyama, et al., "Enhancement of piezoelectric response in scandium aluminum nitride alloy thin films prepared by dual reactive cosputtering", Advanced Materials, vol. 21, 593-596, 2009.
Al-Ahmad, et al., "Piezoelectric-Based Tunable Microstrip Shunt Resonator", Proceedings of Asia-Pacific Microwave Conference, 2006.
Aoyama, et al., "Diffusion of Boron, Phosphorous, Arsenic and Antimony in Thermally Grown SiliconDioxide", Journal of the Electrochemical Society, vol. 146, No. 5, 1879-1883, 1999.
Machine Translation for JP2007028669 published Feb. 1, 2007.
Machine Translation for JP2007006501 published Jan. 11, 2007.
Machine Translation for JP2007295306 published Jan. 11, 2007.
Auld, "Acoustic Fields and Waves in Solids", Acoustic Resonators, Second Edition, vol. II, 250-259, 1990.
Bauer, et al, "Properties of Silicon Implanted with Boron Ions through Thermal Silicon Dioxide", Solid State Electronics, vol. 16, No. 3 ,289-300, Mar. 1973.
Bi, et al., "Bulk Acoustic Wave RF Technology", IEEE Microwave Magazine, vol. 9, Issue 5. 65-80, 2008.
Chen, "Fabrication and Characterization of ALN Thin Film Bulk Acoustic Wave Resonator", Dissertation, University of Pittsburgh School of Engineering, 2006.
Choi, et al., "Design of Half-Bridge Piezo-Transformer Converters in the AC Adapter Applications", APEC 2005, IEEE, 244-248, Mar. 2005.
Coombs, "Electronic Instrument Handbook", Second Edition, McGraw-Hill, Inc. pp. 5.1 to 5.29, 1995.
C-S Lee, et al., "Copper-Airbridged Low-Noise GaAs PHEMT With Ti/WNx/Ti Diffusion Barrier for High-Frequency", IEEE Transactions on Electron Devices, vol. 53 , Issue: 8. 1753-1758, 2006.
Denisse, et al., "Plasma-Enhanced Growth and Composition of Silicon Oxynitride Films", J. Appl. Phys., vol. 60, No. 7. 2536-2542, Oct. 1, 1986.
Fattinger, et al., "Coupled Bulk Acoustic Wave Resonator Filters: Key technology for single-to-balanced RF filters", IEEE MTT-S Digest, 927-929, 2004.
Fattinger, et aL, "Single-To-Balance Filters for Mobile Phones Using Coupled Resonator Baw Technology", 2004 IEEE Ultrasonics Symposium, 416-419, Aug. 2004.
Fattinger, et al., "Spurious Mode Suppression in Coupled Resonator Filters", IEEE MTT-S International Microwave Symposium Digest, 409-412, 2005.
Gilbert, "An Ultra-Miniature, Low Cost Single Ended to Differential Filter for ISM Band Applications", Micro. Symp. Digest, 2008, IEEE MTT-S, 839-842, Jun. 2008.
Grill, et al., "Ultralow-K Dielectrics Prepared by Plasma-Enhanced Chemical Vapor Deposition", App. Phys. Lett, vol. 19, 803-805, 2001.
Hadimioglu, et al., "Polymer Films As Acoustic Matching Layers", 1990 IEEE Ultrasonics Symposium Proceedings, vol. 3, 1337-1340, Dec. 1990.
Hara, "Surface Treatment of Quartz Oscillator Plate by Ion Implantation" Oyo Buturi, vol. 47, No. 2, 145-146, Feb. 1978.
Holzlohner, et al., "Accurate Calculation of Eye Diagrams and Bit Error Rates in Optical Transmission Systems Using Linearization", Journal of Lightwave Technology, vol. 20, No. 3, pp. 3 89-400, Mar. 2002.
Machine Translation for KR100806504 published Feb. 21, 2008.
Search Report for Great Britain Patent Application No. 0617742.2 dated Dec. 13, 2006.

* cited by examiner

SEMICONDUCTOR DEVICE HAVING AN AIRBRIDGE AND METHOD OF FABRICATING THE SAME

The present application is a divisional application under 37 C.F.R. §1.53(b) of commonly owned U.S. patent application Ser. No. 13/017,414 (issued as U.S. Pat. No. 8,962,443 on Feb. 24, 2015) to Timothy J. Whetten et al., entitled "Semiconductor Device having an Airbridge and Method of Fabricating the same", and filed on Jan. 31, 2011, and claims priority under 35 U.S.C. §120 from U.S. Pat. No. 8,962,443. The entire disclosure of U.S. Pat. No. 8,962,443 is specifically hereby incorporated by reference.

BACKGROUND

Suspended airbridges are generally used in semiconductor devices, such as monolithic microwave integrated circuits (MMICs), in order to isolate and reduce parasitic capacitance between conductors, such as gate, source and drain electrodes. Gallium arsenide (GaAs) semiconductor devices, in particular, may include airbridges formed of conductive material applied by electro-deposition or electroplating techniques, such as plated gold (Au). For example, the airbridges may extend from pad areas to various components of the semiconductor devices. The airbridges are typically covered by an insulating layer, such as silicon nitride ($SiN_x$), for isolating and protecting the semiconductor devices from environmental conditions, such as temperature, moisture, debris, and the like.

Conventional fabrication techniques include applying an adhesion layer to the plated conductive material of an airbridge prior to application of the insulating layer. Generally, the adhesion layer applied to the plated conductive material can be applied by a variety of techniques, such as evaporation. Conductive adhesion materials are typically patterned using lithography and either etch or lift-off processes, which require corresponding processing steps. Also, insulating adhesion layer materials provide generally poor adhesion characteristics, often resulting in delamination (e.g., nitride delamination) of the insulating layer from the airbridge. Such delamination increases the risk of operational failures and raises field reliability issues, as well as increases in-line and assembly scrap.

SUMMARY

In a representative embodiment, a method of forming a device having an airbridge on a substrate includes forming a plated conductive layer of the airbridge over at least a photoresist layer on a portion of the substrate, the plated conductive layer defining a corresponding opening for exposing a portion of the photoresist layer. The method further includes undercutting the photoresist layer to form a gap in the photoresist layer beneath the plated conductive layer at the opening, and forming an adhesion layer on the plated conductive layer and the exposed portion of the photoresist layer, the adhesion layer having a break at the gap beneath the plated conductive layer. The photoresist layer and a portion of the adhesion layer formed on the exposed portion of the photoresist layer is removed, which includes etching the photoresist layer through the break in the adhesion layer. An insulating layer is formed on at least the adhesion layer, enhancing adhesion of the insulating layer to the plated conductive layer.

In another representative embodiment, a method is provided for forming an airbridge extending from a conductive area of a gallium arsenide (GaAs) semiconductor device. The method includes applying a first photoresist layer on a substrate, with or without a device, and developing the first photoresist layer to form a first photoresist pattern; applying a conductive lower layer on the first photoresist layer; applying a conductive seed layer on the conductive lower layer; applying a second photoresist layer on the conductive seed layer, and etching the second photoresist layer to form a second photoresist pattern; applying a plated gold layer on the conductive seed layer using an electroplating process; removing the second photoresist pattern using a develop or etching process to form an opening in the plated gold layer corresponding to the airbridge of the semiconductor device, the opening exposing a portion of the conductive seed layer; removing the exposed portion of the conductive seed layer, exposing a portion of the first photoresist pattern within the opening in the plated gold layer; partially etching the exposed portion of the first photoresist pattern using oxygen plasma, the partial etching undercutting the photoresist layer to form a gap between the plated gold layer and the first photoresist pattern at the opening in the plated gold layer; applying an adhesion layer on the plated gold layer and the exposed portion of the first photoresist pattern, the adhesion layer having a break at the gap between the plated gold layer and the first photoresist pattern; removing the first photoresist pattern using a solvent applied to the first photoresist pattern through the break in the adhesion layer, the solvent lifting off a portion of the adhesion layer on the exposed portion of the first photoresist pattern; and applying an insulating layer on the adhesion layer to enhance adhesion of the insulating layer to the plated gold layer.

In another representative embodiment, a semiconductor device includes a device pattern formed on a semiconductor substrate, a seed layer formed on the device pattern, and an airbridge formed on the seed layer, where the airbridge includes a plated conductive material and defines an opening exposing a portion of the device pattern. An adhesion layer is formed on the airbridge layer and extends over at least a portion of sidewalls of the opening defined by the airbridge. An insulating layer is formed on the adhesion layer, such that the adhesion layer enhances adhesion of the insulating layer to the plated conductive material of the airbridge.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
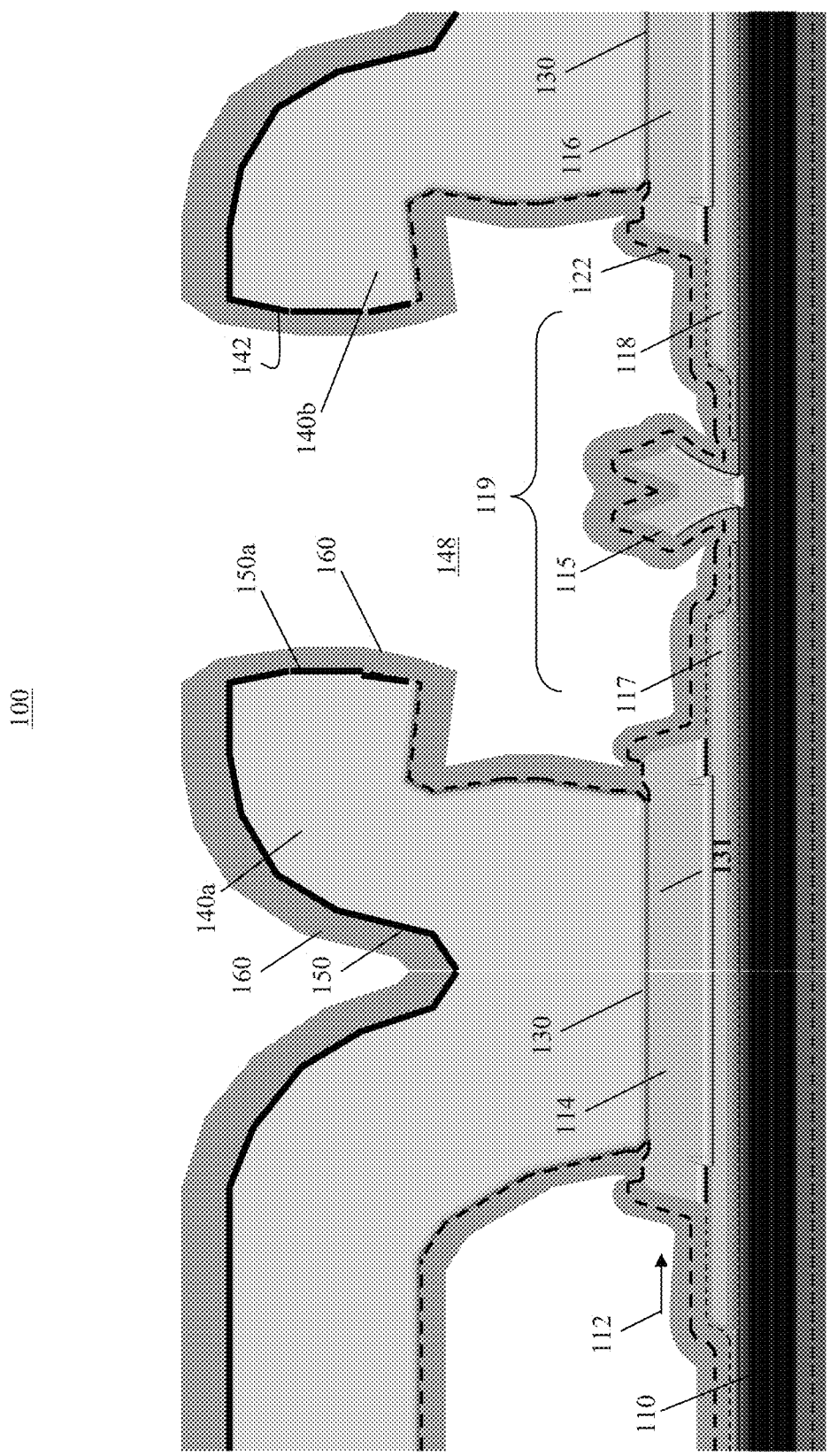
FIG. 1 is a cross-sectional view of a semiconductor device including an airbridge, fabricated according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

FIG. 1 is a cross-sectional view illustrating a semiconductor device including an airbridge, fabricated according to a representative embodiment.

Referring to FIG. 1, device 100, which may be a semiconductor device, such as the transistor in the depicted example, includes pattern 112 on substrate 110. The substrate 110 may be formed of various materials compatible with microfabrication and semiconductor processes, such as silicon (Si), GaAs, indium phosphide (InP), and applicable to any microfabricated suspended structures, including micro-electromechanical systems (MEMS) and the like. The pattern 112 includes a gate electrode (not shown) connected to gate 115, source electrode 114 connected to source 117, and drain electrode 116 connected to drain 118, where the gate 115, the source 117 and the drain 118 form representative transistor 119. When the substrate 110 is formed of GaAs, for example, the transistor 119 may be any of a variety of GaAs transistors, such as a metal semiconductor field effect transistor (MESFET), a high electron mobility transistor (HEMT), a pseudomorphic high electron mobility transistor (pHEMT), an enhancement-mode pseudomorphic high electron mobility transistor (E-pHEMT), a heterojunction bipolar transistor (HBT), or the like. Top surfaces of the transistor 119 are covered by first insulating layer 122.

Airbridges 140a and 140b are formed of plated conductive material, such as plated Au. The airbridges 140a and 140b extend from the source and drain electrodes 114 and 116, respectively, and provide corresponding pad areas for connection of the device 100 to external circuits. The airbridges 140a and 140b are connected to the source and drain electrodes 114 and 116, as well as the gate electrode (not shown), via a conductive seed layer 130. In the depicted illustrative configuration, the airbridges 140a and 140b define opening 142 and air space 148, in which the transistor 119 is situated.

An adhesion layer 150 is applied to surfaces of the airbridges 140a and 140b. In various embodiments, the adhesion layer 150 may be formed of a conductive adhesion material, such as titanium (Ti) or tantalum (Ta), or an insulating adhesion material, such as titanium oxide ($TiO_x$).

As shown, a side portion 150a of the adhesion layer 150 adheres to at least a portion of side walls in the opening 142. A second insulating layer 160 is formed on the adhesion layer 150 and the first insulating layer 122, thereby protecting the airbridges 140a and 140b and the gate electrode, the source electrode 114 and the drain electrode 116 of the transistor 119. According to various embodiments, the adhesion layer 150 improves adhesion characteristics between the airbridges 140a and 140b and the insulating material of the second insulating layer 160. This reduces the possibility of delamination and generally improves field reliability of the device 100.

According to various embodiments, the device 100 may be fabricated using various techniques compatible with microfabrication and semiconductor processes. A non-limiting example of a fabrication process directed to representative device 100 is discussed below with reference to FIGS. 2 and 3A-3J. In the depicted example, it is assumed that the device 100 being fabricated is a GaAs based device. However, it is understood that alternative embodiments may include fabrication of other types of devices, such as silicon based devices, in the case of CMOS or MEMS applications, for example, without departing from the scope of the present teachings.

Figure 2:
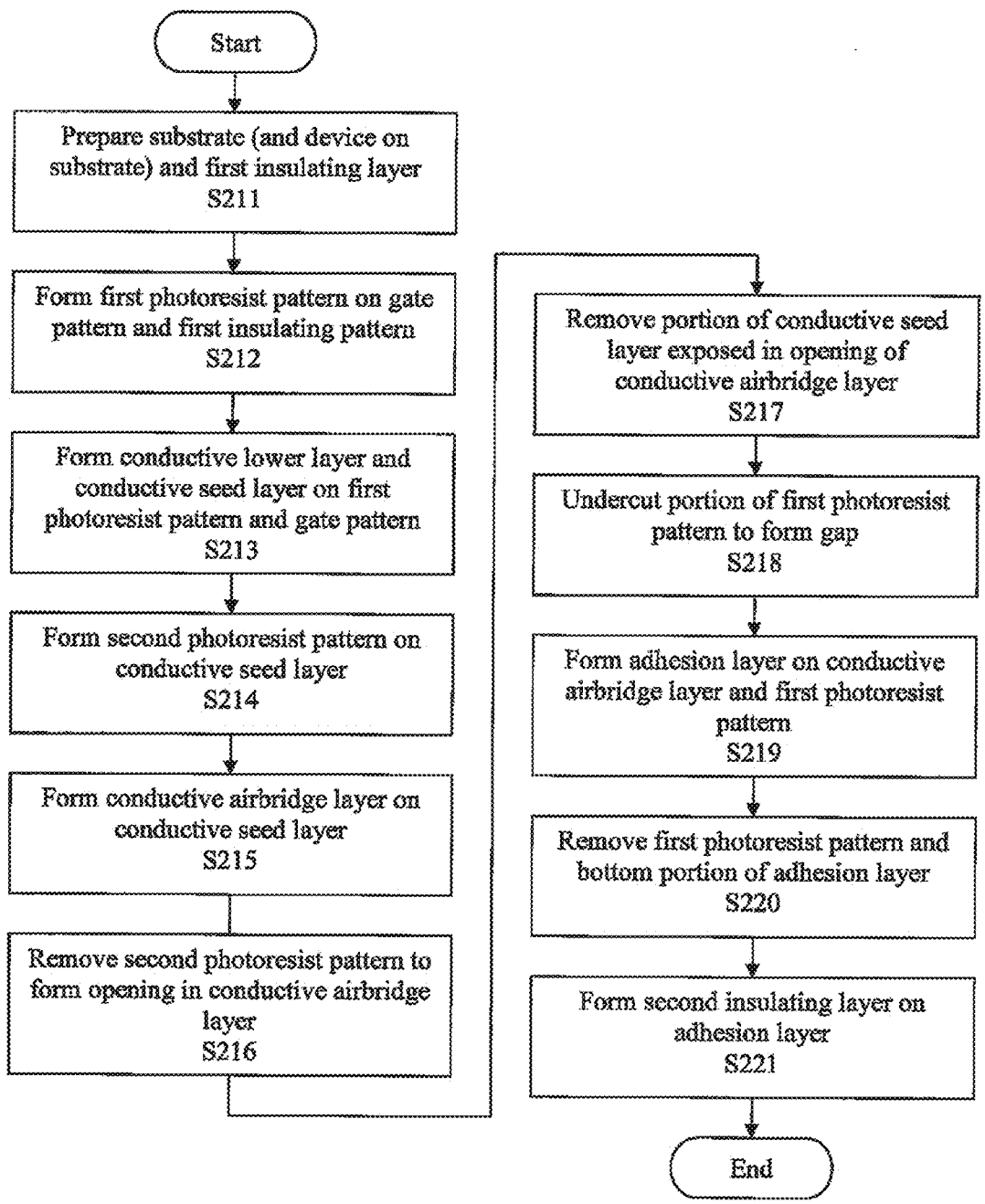
FIG. 2 is a flow diagram illustrating a method of fabricating a semiconductor device including an airbridge, according to a representative embodiment.

FIG. 2 is a flow diagram illustrating a method of fabricating a semiconductor device including an airbridge, according to a representative embodiment. FIGS. 3A-3J are cross-sectional diagrams illustrating the steps of the fabrication process of a semiconductor device, substantially corresponding to the operations depicted in FIG. 2, according to a representative embodiment. Generally, the thickness of the various patterns and/or layers may vary to provide unique benefits for any particular situation or to meet application specific design requirements of various implementations, as would be apparent to one skilled in the art.

In step S211 of FIG. 2, a substrate is prepared using various microfabrication techniques and/or semiconductor processes, where the substrate may or may not include a device. In the example shown in FIG. 3A, a device pattern (e.g., the gate pattern 112) is formed on the substrate 110, and the first insulating pattern 122 is formed on the gate pattern 112, which may form the representative transistor 119 and corresponding source and drain electrodes 114 and 116, for example, although other types of devices (or no device and/or device pattern) may be included, depending on the particular situation and/or application specific design requirements of various implementations, as would be apparent to one skilled in the art. As discussed above, the substrate 110 may be formed of various types of semiconductor materials compatible with microfabrication and semiconductor processes, such as Si, GaAs, InP, or the like. Also, the first insulating pattern 122 may be formed of various types of insulating materials, such as SiN, silicon dioxide ($SiO_2$), or the like. The first insulating pattern 122 mechanically and electrically insulates portions of the gate pattern 112 and the substrate 110.

Figure 3A:
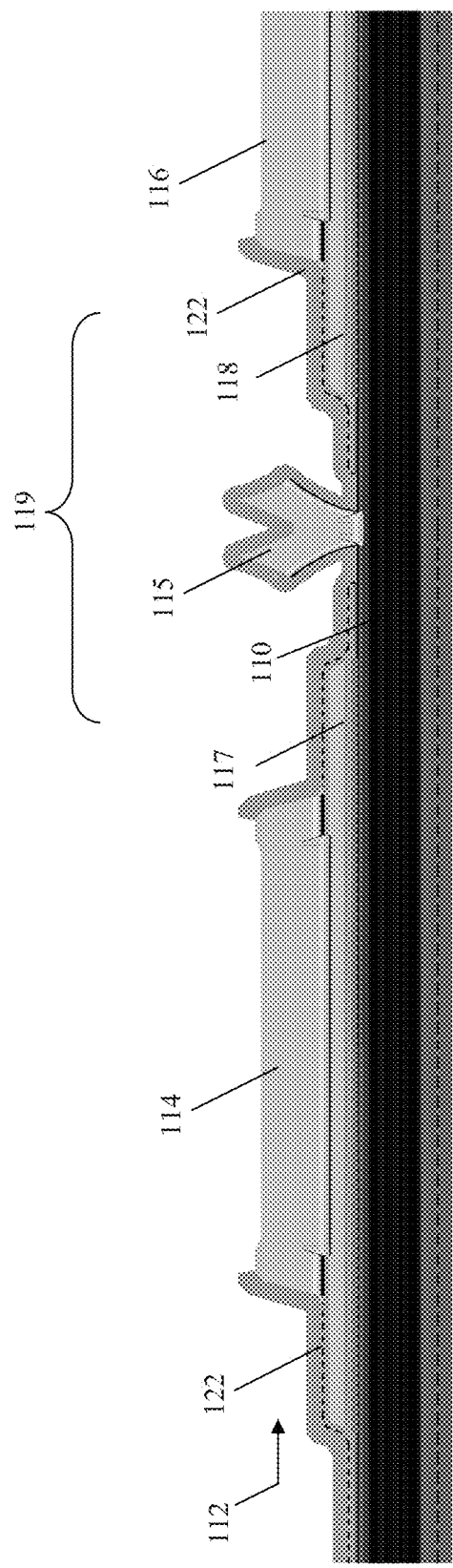
FIGS. 3A-3J are cross-sectional diagrams illustrating steps in a fabrication process of a semiconductor device including an airbridge, according to a representative embodiment.
Figure 3B:
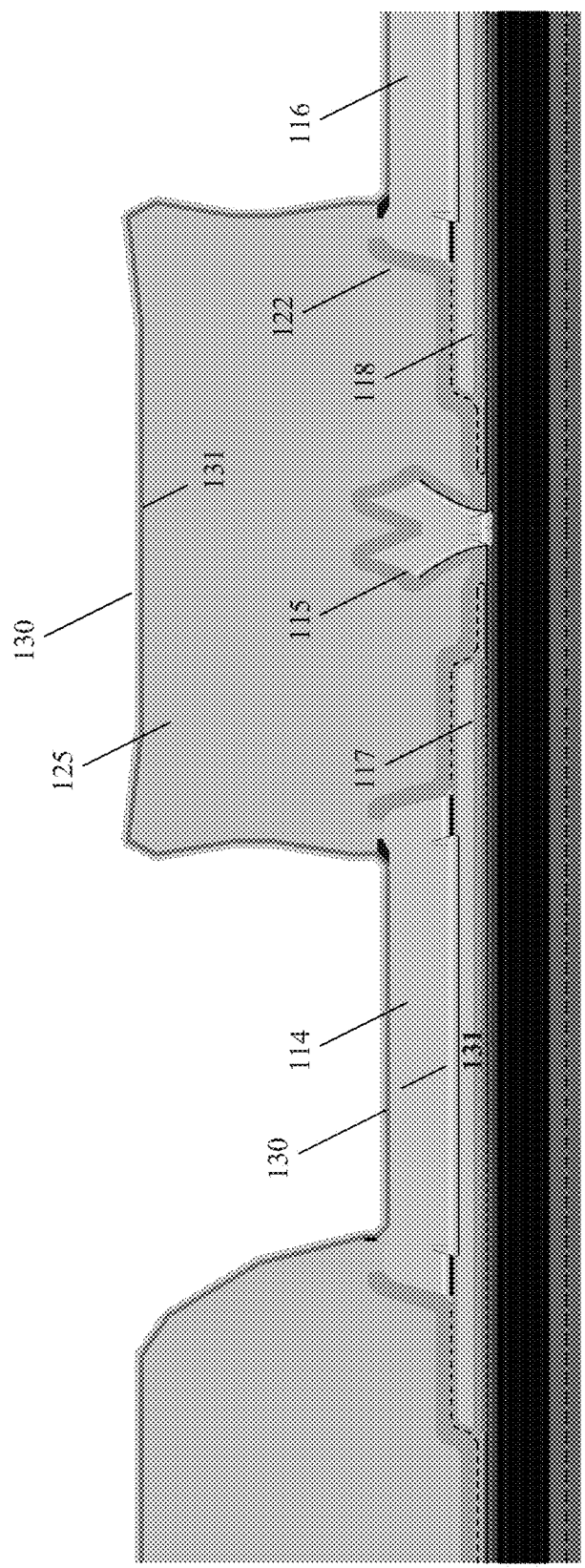

In step S212, a first photoresist pattern 125 is formed on the substrate 110 and device(s) (e.g., including gate pattern 112), and the first insulating pattern 122, as shown in FIG. 3B. In an embodiment, the first photoresist pattern 125 is formed by applying a first photoresist layer (not shown) to upper surfaces of the gate pattern 112 and the first insulating pattern 122. The first photoresist layer may be formed using any photoresist material compatible with microfabrication and semiconductor processes, such as various carbon-based materials, as would be apparent to one of ordinary skill in the art. The first photoresist layer is patterned, and developed or etched to form the first photoresist pattern 125, exposing the top surfaces of the representative source and drain electrodes 114 and 116, as shown in FIG. 3B. In an embodiment, the first photoresist pattern 125 may be baked, e.g., to stabilize it against subsequent electroplating processes, discussed below.

In step S213, a conductive seed layer 130 is formed on the first insulating pattern 122 and the exposed surfaces of the source and drain electrodes 114 and 116, also shown in FIG. 3B. The conductive seed layer 130 may be the same material used to form conductive airbridge layer 141, e.g., Au or plated Au, for example, which functions as contact pads for the device 100, discussed below. The conductive seed layer may be deposited using any of various deposition techniques, such as physical or chemical sputtering, evaporation or chemical vapor deposition (CVD) processes.

In an embodiment, the conductive seed layer 130 is formed on a conductive lower layer 131, which may be formed of a different material. That is, the conductive lower layer 131 is formed on the photoresist pattern 125, the first insulating pattern 122 and the exposed surfaces of the source and drain electrodes 114 and 116, and the conductive seed layer 130 is formed on the conductive lower layer 131. The conductive lower layer may be formed of titanium tungsten (TiW), for example, applied using evaporation, sputtering, or CVD processes. The conductive lower layer of TiW may have a thickness of about 0.1 µm to about 10 µm, and the conductive seed layer of plated Au may have a thickness of about 0.01 µm to about 0.5 µm, for example. Of course, the number of conductive layers and/or the materials forming the conductive layers may vary, without departing from the scope of the present teachings. The previous baking of the first photoresist pattern 125, discussed above, prevents the first photoresist pattern 125 from being lifted, or otherwise damaged during application of the conductive seed layer 130 and/or the conductive lower layer 131. Also, prior to applying the conductive seed layer 130 and/or the conductive lower layer 131, the surfaces of the first insulating pattern 122 and the source and drain electrodes 114 and 116 may be prepared, e.g., by performing a cleaning process, such as de-scum.

Figure 3C:
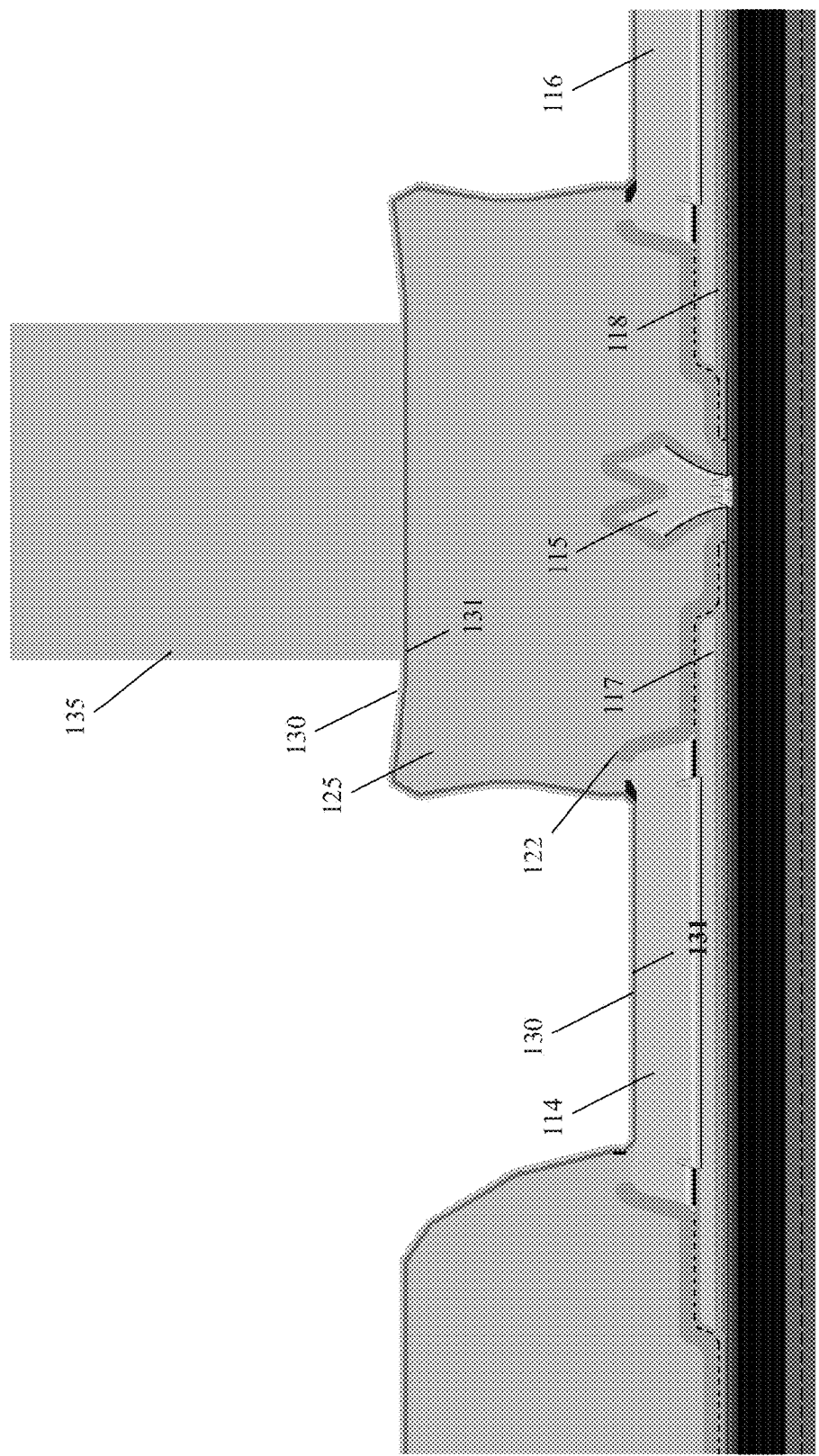

A second photoresist pattern 135 is formed on the conductive seed layer 130 in step S214, as shown in FIG. 3C. In an embodiment, the second photoresist pattern 135 is formed by applying a second photoresist layer (not shown) to an upper surface of the conductive seed layer 130. The second photoresist layer may be formed using any photoresist material compatible with microfabrication and semiconductor processes, such as various carbon-based materials, as would be apparent to one of ordinary skill in the art. The second photoresist layer is patterned, and developed or etched to form the second photoresist pattern 135, which covers a portion of the conductive seed layer 130 on the first photoresist pattern 125 over gate 115 of the representative transistor 119, as shown in FIG. 3C. The patterning and etching may be performed in substantially the same manner discussed above with regard to the first photoresist pattern 125.

Figure 3D:
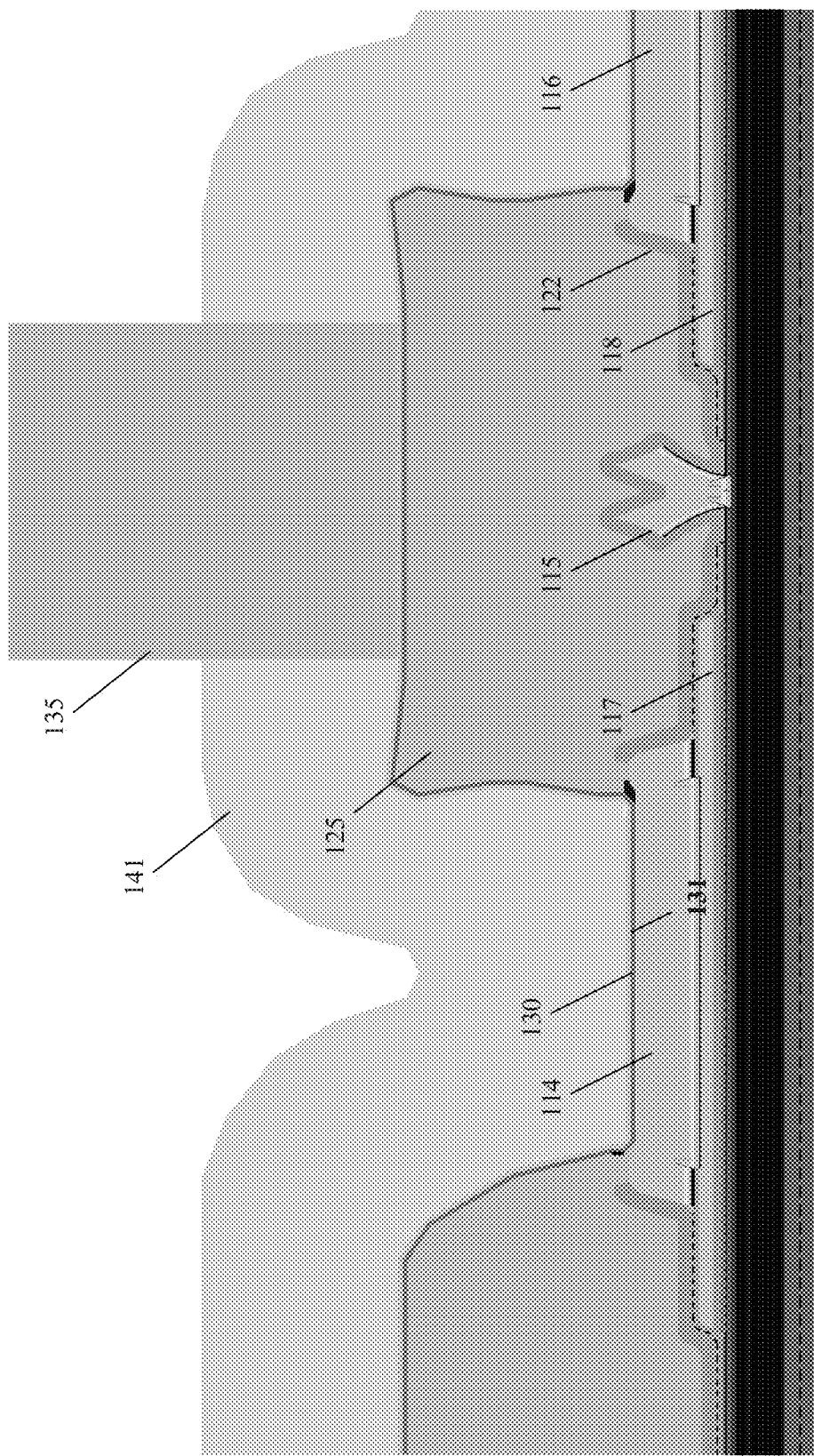

In step S215, conductive airbridge layer 141 is formed on the conductive seed layer 130, shown in FIG. 3D. The conductive airbridge layer 141 is formed of a conductive material, e.g., suitable for contact pads, as would be apparent to one of ordinary skill in the art. For example, the conductive airbridge layer may be formed of Au. In an embodiment, the conductive airbridge layer 141 is applied using an electro-deposition or electroplating process. A bottom surface of the conductive airbridge layer 141 mechanically and electrically contacts the conductive seed layer 130, and is therefore electrically connected to the source and drain electrodes 114 and 116 and/or the substrate 110. The second photoresist pattern 135 creates a separation in the conductive airbridge layer 141 over the gate electrode 115 of the representative transistor 119, as shown in FIG. 3D.

Figure 3E:
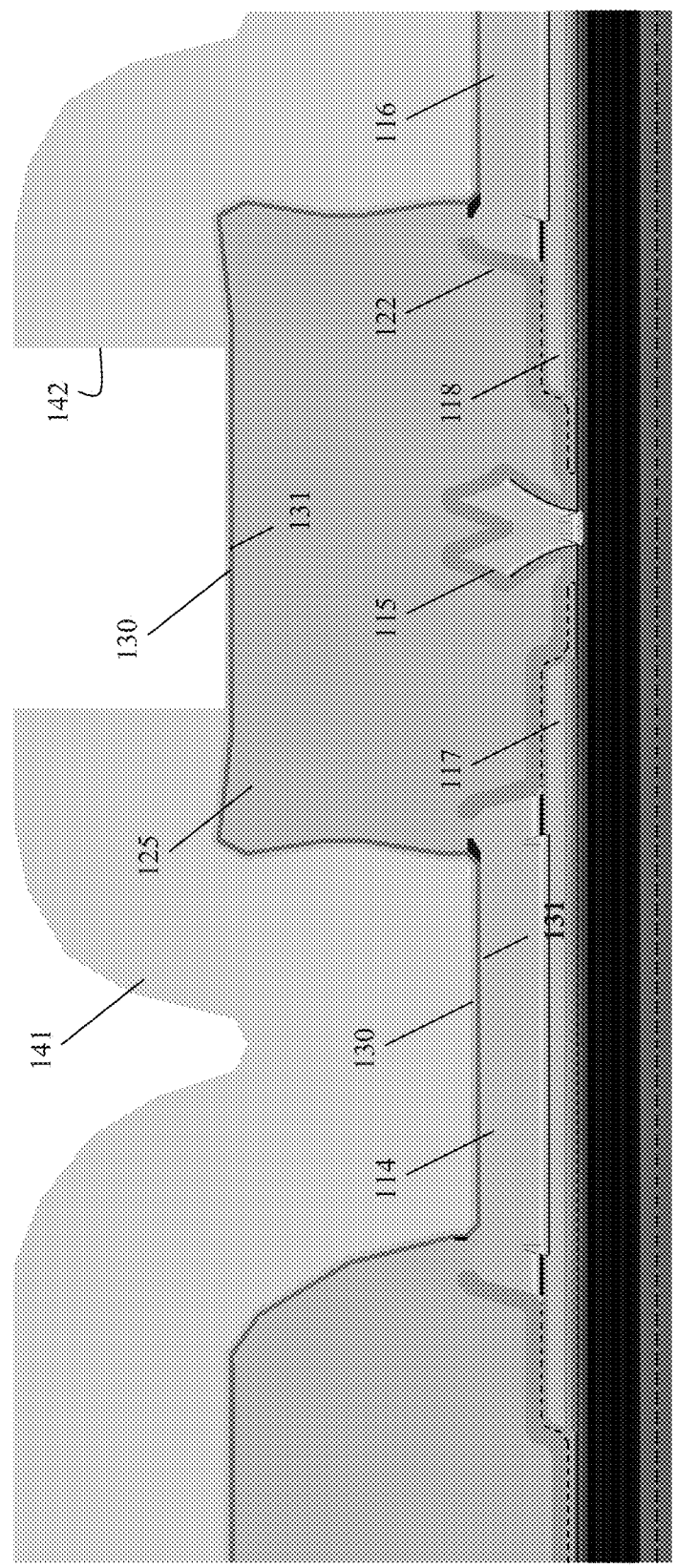

The second photoresist pattern 135 is removed in step S216, as shown in FIG. 3E. In an embodiment, the second photoresist pattern 135 may be removed using a flood expose and develop process. For example, the second photoresist pattern 135 may be flood exposed to ultra violet light and developed away. The flood expose and develop process avoids conventional use of nonselective solvents in step S216, which may cause the conductive seed layer 130 to wrinkle and/or the first photoresist pattern 125 to collapse, for example. Removal of the second photoresist pattern 135 results in an opening 142 in the conductive airbridge layer 141, which exposes a portion of the conductive seed layer 130 within the opening 142, as shown in FIG. 3E. In the depicted embodiment, the opening 142 is shown as having substantially parallel side walls, although alternative embodiments may include side walls having various orientations, without departing from the scope of the present teachings.

Figure 3F:
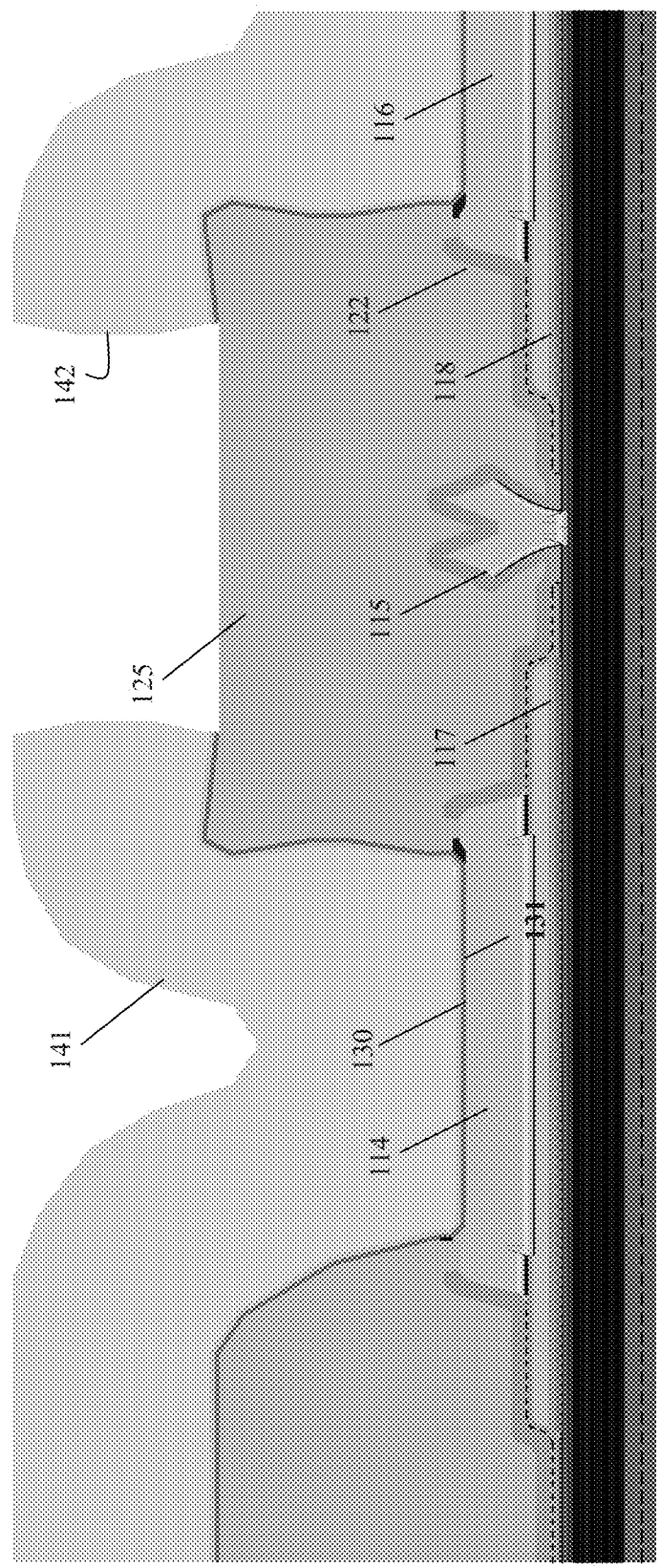

The exposed portion of the conductive seed layer 130 (and the conductive lower layer 131) is removed in step S217, exposing a portion of the top surface of the first photoresist pattern 125 within the opening 142, as shown in FIG. 3F. For example, the exposed portion of the conductive seed layer 130 may be removed using a de-plating (e.g., reverse electroplating) process and the conductive lower layer 131 may be removed using a subsequent etch process. For example, when the conductive seed layer 130 is formed of plated Au, it may be removed using a de-plating process, which attacks the conductive seed layer 130 within the opening 142. Since the conductive seed layer 130 is thinner than the airbridge layer 141, the conductive seed layer 130 can be removed without substantially damaging the airbridge layer 141. Likewise, when the conductive lower layer 131 is formed of TiW, it may be short etched using hydrogen peroxide ($H_2O_2$), for example, where the conductive airbridge layer 141 acts as an etch mask and where the $H_2O_2$ may etch an inconsequential amount of the top surface of the first photoresist pattern 125. Of course, other techniques for removing the exposed portion of the conductive seed layer 130 and the conductive lower layer 131 may be incorporated, without departing from the scope of the present teachings.

Figure 3G:
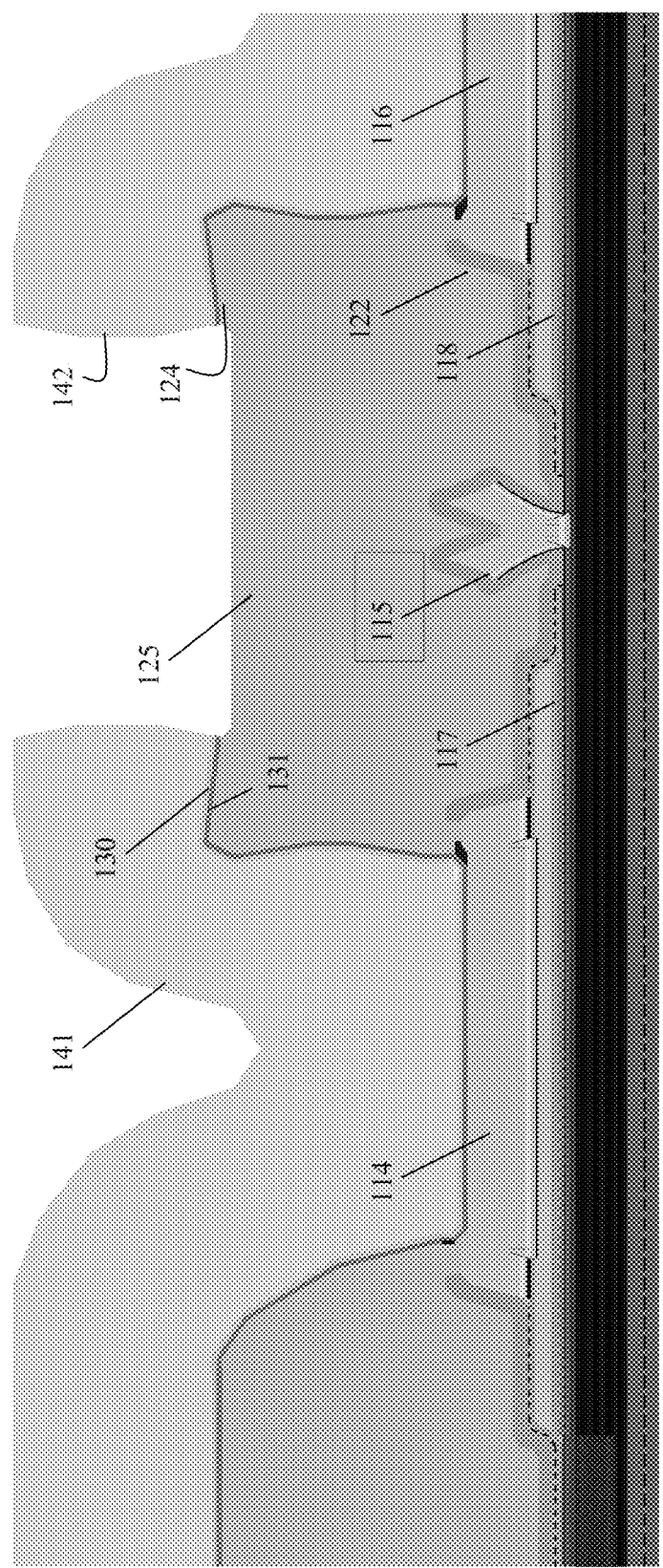

In step S218, a portion of first photoresist pattern 125 is undercut to form a gap 124 in the first photoresist pattern 125 beneath the conductive airbridge layer 141 (as well as the conductive seed layer 130 and the conductive lower layer 131), substantially around a periphery of the opening 142, as shown in FIG. 3G. In an embodiment, the first photoresist pattern 125 may be undercut by plasma ashing or plasma etching processes, using oxygen plasma, for example, where the conductive airbridge layer 141 acts as an etch mask. The gap 124 formed by the plasma etching process may extend about 0.01 µm to about 0.5 µm beneath the conductive seed layer 130 and the conductive airbridge layer 141, for example. Of course, other types of plasma and/or other techniques for undercutting the first photoresist pattern 125 may be incorporated without departing from the scope of the present teachings.

Figure 3H:
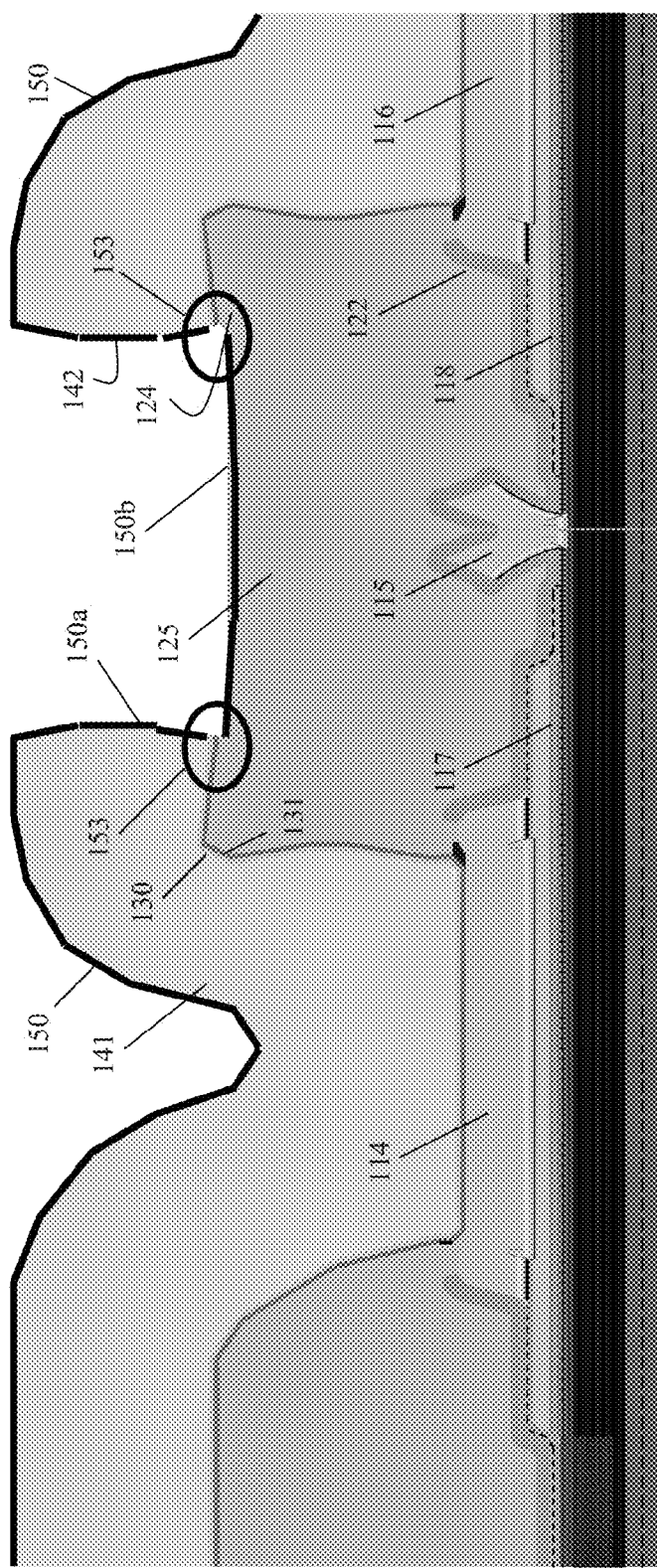

In step S219, an adhesion layer 150 is formed on a top surface of the conductive airbridge layer 141 and the exposed portion of the first photoresist pattern 125 within the opening 142, as shown in FIG. 3H. In various embodiments, the adhesion layer 150 is formed by applying an adhesion material, such as TiO$_x$, Ti or Ta, using evaporation or sputter deposition techniques, for example, although other application techniques may be incorporated. For example, the adhesion layer 150 may be formed of Ti having a thickness of about 0.005 μm to about 0.2 μm.

Notably, a side portion 150a of the adhesion layer 150 adheres to the side walls of the opening 142, although the side portion 150a may be generally thinner than top coverage of the adhesion layer 150. Also, the side portion 150a may not necessarily cover the entirety of the side walls in the opening 142. A bottom portion 150b of the adhesion layer 150 is applied to the exposed portion of the first photoresist pattern 125 within the opening 142. A break 153 is formed in the adhesion layer 150 at the gap 124, substantially separating the side portion 150a from the bottom portion 150b of the adhesion layer 150. In other words, the adhesion layer 150 is not continuously formed throughout the opening 142.

Figure 3I:
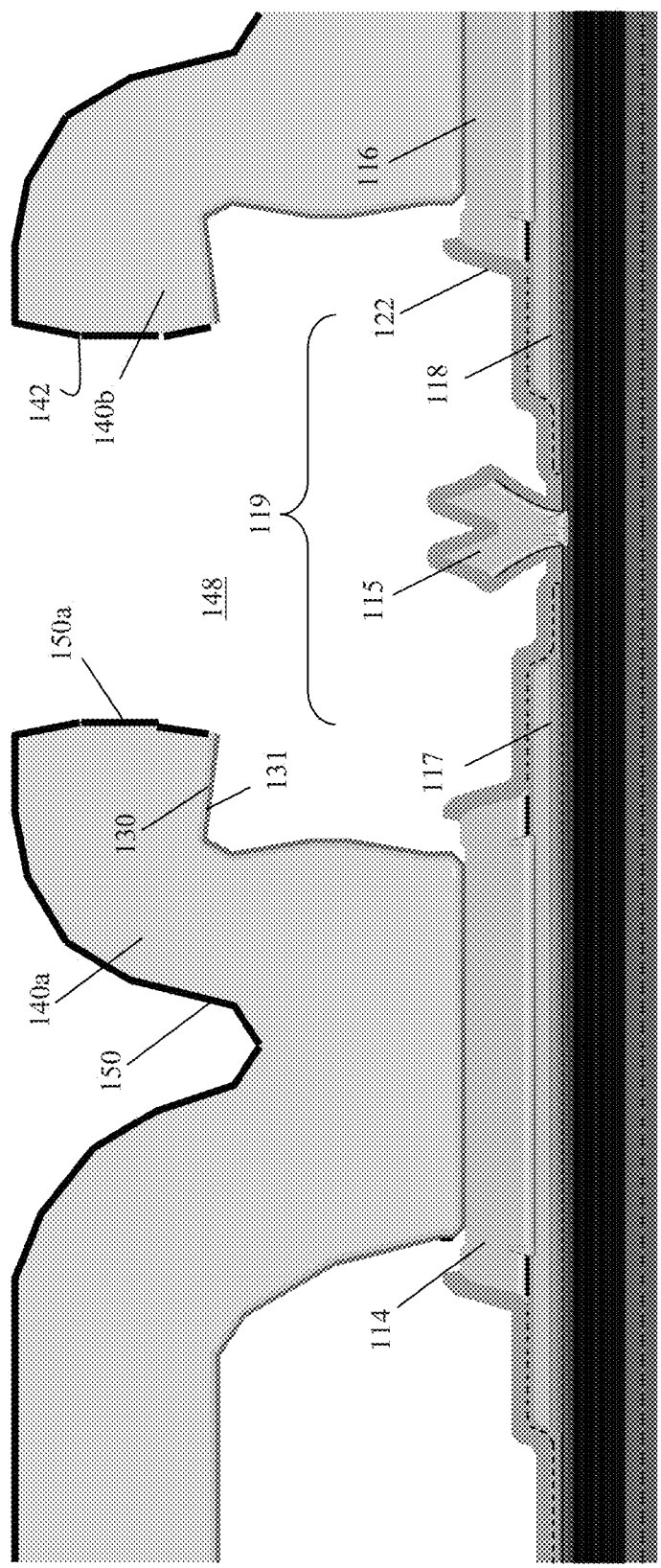

The first photoresist pattern 125 is removed in step S220, as shown in FIG. 3I. In an embodiment, the first photoresist pattern 125 is removed by wet etching using a solvent, such as N-methyl-pyrrolidone (NMP), for example, although other techniques for removing the first photoresist pattern 125 may be incorporated. In addition, the bottom portion 150b of the adhesion layer 150 is removed in step S220 along with the first photoresist pattern 125. For example, when the first photoresist pattern 125 is removed by wet etching, the solvent penetrates the first photoresist pattern 125 through the break 153 formed in the adhesion layer 150. Thus, in the course of the etching process, the bottom portion 150b of the adhesion layer 150 is "lifted off" due to the solvent undercutting the first photoresist pattern 125.

Removal of the first photoresist pattern 125 and the bottom portion 150b of the adhesion layer 150 exposes the first insulating pattern 122 of the transistor 119 within a resulting air space 148, via the opening 142. Also, the conductive airbridge layer 141 forms airbridges 140a and 140b extending from the source and drain electrodes 114 and 116, respectively, over the resulting air space 148. The airbridges 140a and 140b may be connected or serve as pad areas for the source and drain electrodes 114 and 116, respectively.

Figure 3J:
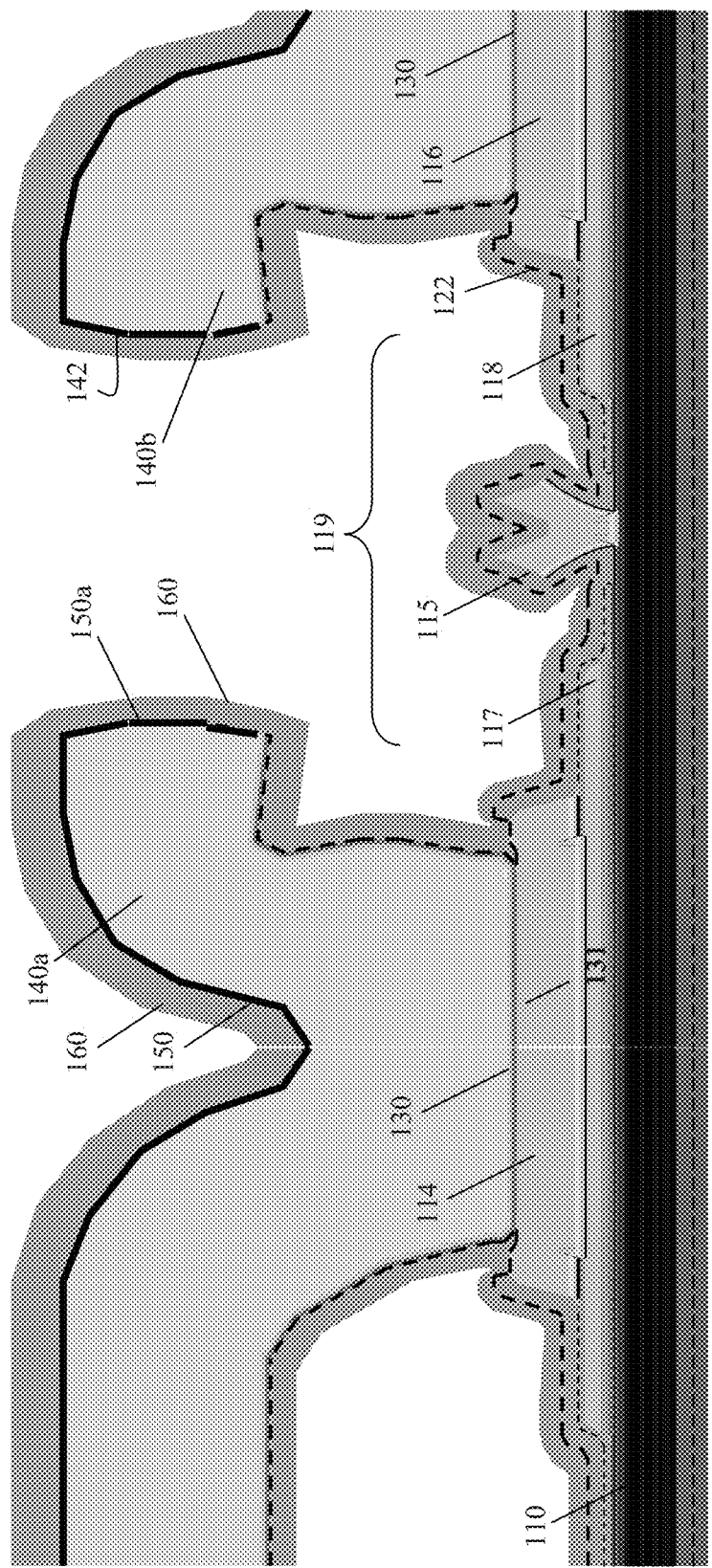

In step S221, second insulating layer 160 is formed on the adhesion layer 150, portions of the conductive lower layer 131, and the first insulating pattern 122, resulting in the device 100, as shown in FIG. 3J. More particularly, the second insulating layer 160 is formed by applying an insulating material, such as SiN, SiO$_2$, or the like, using evaporation, spin-on, sputtering, or CVD processes, for example, although other application techniques may be incorporated. Notably, spin-on and CVD processes, in particular, enable effective coating of the under sides of the airbridges 140a and 140b by the second insulating layer 160. Also, prior to applying the second insulating layer 160, the surfaces of the adhesion layer 150, the conductive lower layer 131, and the first insulating pattern 122 may be prepared, e.g., by performing a cleaning process, such as de-scum. The second insulating layer 160 covers the exposed top surfaces of the adhesion layer 150, bottom surfaces of the conductive lower layer 131, and top surfaces of the first insulating pattern 122 (adding insulating material to the first insulating pattern 122). In an embodiment, the device 100 may be annealed, e.g., to relieve stress in the airbridges 140a and 140b. Notably, the adhesion layer 150 enhances adhesion between the second insulating layer 160 and the airbridges 140a and 140b, preventing lifting or separating of the second insulating layer 160. Generally, good adhesion between the second insulating layer 160 and the airbridges 140a and 140b along the top surfaces and side surfaces (e.g., in the opening 142), delamination does not occur even were there is no second insulating layer 160, such as the side surfaces of the airspace 148. The second insulating layer 160 protects the gate pattern 112 and/or the transistor 119 from various environmental conditions, including moisture, temperature, debris, and the like.

According to various embodiments, a semiconductor device having an improved adhesion between an insulating layer and a plated conductive material of an airbridge, resulting in a more robust semiconductor device. This enables operation of the semiconductor device in harsher environments, and otherwise increases reliability and manufacturing efficiency of the semiconductor device. In addition, conventional techniques for applying conductive adhesion materials, such as titanium, are typically patterned using lithography and either etch or lift-off processes, as mentioned above. However, the various embodiments provide a self-aligned process that does not require a lithography step (or subsequent etching or lift-off), and is therefore less expensive and less complicated, particularly with respect to raised airbridge structures.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A semiconductor device, comprising:
a device pattern formed on a semiconductor substrate;
a seed layer formed on the device pattern;
an airbridge formed on the seed layer, the airbridge comprising a plated conductive material and defining an opening leading to a corresponding air space in which at least a portion of the device pattern is positioned, the opening being narrower than the corresponding air space, which extends below the airbridge;
an adhesion layer formed on the airbridge and extending over at least a portion of sidewalls of the opening defined by the airbridge; and
an insulating layer formed on the adhesion layer such that the adhesion layer is between the insulating layer and the airbridge, including in the opening defined by the airbridge, enhancing adhesion of the insulating layer to the plated conductive material of the airbridge.

2. The device of claim 1, wherein the plated conductive material comprises gold and the insulating layer comprises silicon nitride.

3. The device of claim 2, wherein the adhesion layer comprises a conductive adhesion material.

4. The device of claim 2, wherein the seed layer comprises plated gold.

5. The device of claim 1, wherein the adhesion layer comprises titanium.

6. The device of claim 1, wherein the adhesion layer comprises tantalum.

7. The device of claim 1, wherein the adhesion layer comprises titanium oxide.

8. The device of claim 1, wherein the semiconductor substrate comprises gallium arsenide (GaAs).

9. The device of claim 8, wherein the semiconductor device comprises one of a monolithic microwave integrated circuit (MMIC), a metal semiconductor field effect transistor (MESFET), a high electron mobility transistor (HEMT), a pseudomorphic high electron mobility transistor (pHEMT), an enhancement-mode pseudomorphic high electron mobility transistor (E-pH EMT), a heterojunction bipolar transistor (HBT).

10. A semiconductor device, comprising:
a transistor formed on a semiconductor substrate, the transistor comprising a gate, a source and a drain; a first insulating layer formed over the gate, the source and the drain of the transistor;
a conductive seed layer formed on a source electrode connected to the source and on a drain electrode connected to the drain of the transistor;
airbridges formed on the conductive seed layer and extending from each of the source electrode and the drain electrode, the airbridges comprising a conductive material and defining an opening between the airbridges, the opening leading to a corresponding airspace in which at least a portion of the transistor is positioned;
a second insulating layer formed over outer surfaces of the airbridges, including sidewalls of the opening, and further formed on the first insulating layer; and
an adhesion layer formed between a portion of each of the airbridges and a corresponding portion of the second insulating layer to adhere the corresponding portion of the second insulating layer to the portion of each of the airbridges, wherein the portion of each of the airbridges and the corresponding portion of the second insulating layer includes at least a portion of sidewalls of the opening defined by the airbridges.

11. The semiconductor device of claim 10, wherein the airbridges extend over portions of the corresponding air space.

12. A semiconductor device, comprising:
a device pattern formed on a semiconductor substrate;
a seed layer formed on the device pattern;
a first airbridge formed on the seed layer comprising a plated conductive material;
a second airbridge formed on the seed layer comprising a plated conductive material, wherein the first airbridge and the second airbridge are separated by an opening and a corresponding air space, defined by the first airbridge and the second airbridge, at least a portion of the device pattern being positioned within the corresponding air space;
an adhesion layer formed on each of the first airbridge and the second airbridge, extending over at least a portion of sidewalls of the opening separating the first airbridge and the second airbridge; and
an insulating layer formed on the adhesion layer on each of the first airbridge and the second airbridge, such that the adhesion layer is between the insulating layer and each of the first airbridge and the second airbridge, including on the adhesion layer extending over the at least a portion of the sidewalls of the opening, wherein the adhesion layer adheres the insulating layer to the plated conductive material of the first airbridge and the second airbridge.

13. The device of claim 12, wherein each plated conductive material comprises gold and the insulating layer comprises silicon nitride.

14. The device of claim 13, wherein the adhesion layer comprises a conductive adhesion material.

15. The device of claim 13, wherein the seed layer comprises plated gold.

16. The device of claim 12, wherein the semiconductor device comprises a transistor formed on the semiconductor substrate, the transistor comprising a gate, a source and a drain.

17. The device of claim 16, wherein the first airbridge extends from a source electrode electrically connected to the source of the transistor, and the second airbridge extends from a drain electrode electrically connected to the drain of the transistor.

* * * * *